(12) United States Patent
Saito

(10) Patent No.: US 7,532,502 B2
(45) Date of Patent: May 12, 2009

(54) SPIN INJECTION MAGNETIC DOMAIN WALL DISPLACEMENT DEVICE AND ELEMENT THEREOF

(75) Inventor: Akira Saito, Yokosuka (JP)

(73) Assignee: Fuji Electric Holdings Co., Ltd. (JP)

( * ) Notice: Subject to any disclaimer, the term of this patent is extended or adjusted under 35 U.S.C. 154(b) by 584 days.

(21) Appl. No.: 11/278,613

(22) Filed: Apr. 4, 2006

(65) Prior Publication Data
US 2006/0238191 A1 Oct. 26, 2006

(30) Foreign Application Priority Data
Apr. 4, 2005 (JP) ............... 2005-107114

(51) Int. Cl.
G11C 11/14 (2006.01)
G11C 11/15 (2006.01)
H01L 43/02 (2006.01)

(52) U.S. Cl. ............... 365/158; 365/171; 365/173; 257/421

(58) Field of Classification Search ............ 365/171, 365/173, 158; 257/421
See application file for complete search history.

(56) References Cited

U.S. PATENT DOCUMENTS

| 5,475,304 | A | * | 12/1995 | Prinz .................. 324/207.21 |
| 6,074,707 | A | | 6/2000 | Nakazawa et al. |
| 6,249,453 | B1 | | 6/2001 | You et al. |
| 6,600,638 | B2 | | 7/2003 | Gill |
| 6,903,400 | B2 | | 6/2005 | Kikuchi et al. |

(Continued)

FOREIGN PATENT DOCUMENTS

JP 2004-207707 A 7/2004

OTHER PUBLICATIONS

Yamanouchi, Michihiko, et al. "Abstract for 60th Annual Meeting Phys. Soc. Jpn." Mar. 27, 2005. p. 27aYP-5. Japan.

(Continued)

*Primary Examiner*—Evan Pert
(74) *Attorney, Agent, or Firm*—Rossi, Kimms & McDowell LLP

(57) ABSTRACT

A spin injection magnetic domain wall displacement wall displacement device has a plurality of spin injection magnetic domain wall displacement elements. Each element includes a magnetic domain wall displacement layer having a magnetic domain wall, a first magnetic layer group having at least one ferromagnetic layer, and a second magnetic layer group having at least one ferromagnetic layer. The first magnetic layer group is disposed at one end or side of the magnetic domain wall displacement layer and the second magnetic layer group disposed at the other end or side thereof. The magnetic domain wall in the magnetic domain wall displacement layer is displaced by flowing electrons between the first magnetic layer group and the second magnetic layer group. Part of the magnetic domain wall displacement layer can be in antiferromagnetic coupling with the first magnetic layer group, and the other part of the magnetic domain wall displacement layer can be in antiferromagnetic or ferromagnetic coupling with the second magnetic layer group. The element enables detection of the displacement of the magnetic domain wall by measuring the change in the electric resistance. Moreover, the magnetic domain wall displacement at a high speed with a low level current and thermal stability of the recorded magnetic domain wall can be made compatible.

29 Claims, 19 Drawing Sheets

U.S. PATENT DOCUMENTS

| | | | |
|---|---|---|---|
| 6,956,257 B2* | 10/2005 | Zhu et al. | 257/295 |
| 7,242,604 B2* | 7/2007 | Klaeui et al. | 365/145 |
| 2003/0085413 A1* | 5/2003 | Wunderlich | 257/200 |
| 2004/0145850 A1 | 7/2004 | Fukumoto et al. | |
| 2005/0045913 A1 | 3/2005 | Nguyen et al. | |
| 2006/0221674 A1* | 10/2006 | Braun et al. | 365/158 |
| 2007/0217256 A1* | 9/2007 | Ono | 365/171 |
| 2007/0242505 A1* | 10/2007 | Ochiai et al. | 365/171 |
| 2008/0094760 A1* | 4/2008 | Lee et al. | 360/324.11 |
| 2008/0137405 A1* | 6/2008 | Ohno et al. | 365/173 |

OTHER PUBLICATIONS

Berger, L. "Emission of spin waves by a magnetic multilayer traversed by a current." Physical Review B.; Oct. 1, 1996. pp. 9353-9358; vol. 54, No. 13. USA.

Slonczewski, J.C. "Letter to the Editor: Current-drive excitation of magnetic multilayers."; Journal of Magnetism and Magnetic Materials 159; 1996; pp. L1-L7; USA.

Katine, J.A. et al. "Current-Driven Magnetization Reversal and Spin-Wave Excitations in Co/Cu/Co Pillars"; Physical Review Letters; Apr. 2000; vol. 84, No. 14; pp. 3149-3152; USA.

Yamaguchi, A et al. "Real-Space Observation of Current-Driven Domain Wall Motion in Submicron Magnetic Wires"; Physical Review Letters; Feb. 20, 2004; vol. 92, No. 7; pp. 077205-1-077205-4; USA.

Related co-pending U.S. Appl. No. 11/379,474; Akira Saito; "Spin Injection Magnetic Domain Wall Displacement Device and Element Thereof"; filed Apr. 20, 2006; Spec. pp. 1-42; Figs. 1-14B.

Related co-pending U.S. Appl. No. 11/475,835; Akira Saito; "Spin Injection Magnetization Reversal Element"; filed Jun. 27, 2006.

* cited by examiner

SPIN INJECTION MAGNETIC DOMAIN WALL DISPLACEMENT DEVICE AND ELEMENT THEREOF

BACKGROUND

FIG. 18 schematically shows a cross sectional structure for explaining an example of an arrangement of a previously proposed GMR (Giant Magneto-Resistance) element making use of a GMR effect. For example, on a silicon substrate 200, a first electrode 201, a first ferromagnetic layer 203 (with a thickness of approximately 40 nm and a diameter of approximately 100 nm) made of a material such as Co, a nonmagnetic metal layer 204 (with a thickness of approximately 6 nm and a diameter of approximately 100 nm), a second ferromagnetic layer 205 (with a thickness of approximately 2.5 nm and a diameter of approximately 100 nm) made of a material such as Co, and a second electrode 206 are formed in this order. Further, a bit line 207 is formed on the first electrode 201. It is known that such a GMR element can reverse the direction of magnetization of the second ferromagnetic layer 205 by spin current injection from the second electrode 206 side, that is, injection of electrons with polarized spins from the first electrode 201 side. See for example JP-A-2004-207707 and J. A. Katine, et al., *Current-Driven Magnetization Reversal and Spin-Wave Excitations in Co/Cu/Co Pillars*, Physical Review Letters, Vol. 84, No. 14, pp. 3149-3152 (2000).

The operation principle of the element is explained as follows. First, a magnetic field with a sufficient strength is applied to the element to align the directions of magnetization of the first ferromagnetic layer 203 and the second ferromagnetic layer 205 in the same direction. FIG. 19A schematically show a cross sectional view of the element shown in FIG. 18 in which the direction of magnetization in the ferromagnetic layers are aligned rightwardly (arrows in the figure showing the direction of magnetization) in each ferromagnetic layer. In the following drawings, arrows have the same meaning. The state is to be referred to as the parallel state (P-state). In this state, an electric current flowing in the direction from the second electrode 206 side to the first electrode 201 side causes electrons to be injected from the first electrode 201 to the first ferromagnetic layer 203. In the first electrode 201, the electron spins are in a state in which the distribution of up-spins corresponds to that of down-spins. In the ferromagnetic layers, however, due to interaction (s-d interaction) between the electron spins and the spins of ferromagnetic metal atoms, the directions of the electron spins are aligned with the direction of magnetization of the first ferromagnetic layer. This is referred to as polarization of spin. Injection of electrons with thus polarized spins into the second ferromagnetic layer 205 through the nonmagnetic metal layer 204 exerts a torque on the magnetization of the ferromagnetic layer 205 in the direction expressed by following Equation (1):

$$j \cdot M(\text{ferromagnetic layer 205}) \times M(\text{ferromagnetic layer 203}) \times M(\text{ferromagnetic layer 205}) \quad (1),$$

where j is a current (a scalar quantity), M(ferromagnetic layer 205) is a unit vector in the direction of the magnetization of the ferromagnetic layer 205, and M(ferromagnetic layer 203) is a unit vector in the direction of the magnetization of the ferromagnetic layer 203.

The torque expressed by Equation (1) is also exerted to the magnetization of ferromagnetic layer 203. The ferromagnetic layer 203, however, has a thickness sufficiently larger than the thickness of the ferromagnetic layer 205, so that the magnetization of the ferromagnetic layer 203 is unaffected. Therefore, a current exceeding a certain level of a critical current causes only the direction of the magnetization of the ferromagnetic layer 205 to rotate by the exerted torque, by which the state of the magnetization between the ferromagnetic layer 205 and the ferromagnetic layer 203 changes from the P-state shown in FIG. 19A to an anti-parallel state (AP state) shown in FIG. 19B.

An explanation is made when a current flows from the first electrode 201 to the second electrode 206 in the element in the AP-state. In this case, the sign of the current in Equation (1) expressing the direction of torque becomes negative, so that a torque in the direction opposite to the above is exerted on the magnetization of the ferromagnetic layer 205. As a result, a current exceeding a certain level of a critical current causes the direction of the magnetization of the ferromagnetic layer 205 to be inverted, by which the state of the magnetization in the element returns from the AP-state to the P-state shown in FIG. 19A. The electric resistance of a GMR element is known to be small in the p-state and large in the AP-state with the rate of change being several tens of percent. By using the GMR effect, a reading head can be manufactured for a hard disk. FIG. 20 is a schematic view showing a planar structure of an MRAM (Magnetic Random Access Memory) in which a plurality of the GMR elements shown in FIG. 18 are connected to use the inversion of magnetization of GMR elements by current injection. With the use of the arrangement as shown in FIG. 20, writing (inversion of magnetization) and reading (detection of electric resistance values corresponding to states of magnetization of recording cells 209) of bit information to and from the recording cells 209 are principally possible by a group of laterally running word lines 208 and a group of longitudinally running bit lines 207.

FIGS. 21, 22A, and 22B schematically illustrate cross sectional views each for explaining a phenomenon of displacement of a magnetic domain wall formed in a ferromagnetic wire in a related magnetic domain wall displacement element by a current flowing in the ferromagnetic wire. See for example A. Yamaguchi, et al., *Real-Space Observation of Current-Driven Domain Wall Motion in Submicron Magnetic Wires*, Physical Review Letters, Vol. 92 No. 7, 077205 (2004). FIG. 21 is a schematic cross sectional view showing an arrangement of the element, in which a ferromagnetic layer 221 (10 nm in thickness and several micrometers in length) is formed on an insulator substrate 220. On the ferromagnetic layer 221, a first electrode 222 and a second electrode 223 are formed. For the ferromagnetic layer 221, a material such as a permalloy ($Ni_{81}Fe_{19}$) thin film is used. For the first and second electrodes 222 and 223, a material such as copper (Cu), gold (Au), or platinum (Pt) is used. FIGS. 22A and 22B are schematic cross sectional views for explaining the principle of displacement of a magnetic domain wall 224 when a current flows between the first electrode 222 and the second electrode 223. In each of the views, the directions of magnetization in the magnetic layer are shown with arrows like in the above explanation.

First, as shown in FIG. 22A, consider the case in which there is one magnetic domain wall 224 in the region of the ferromagnetic layer 221 between two electrodes and the direction of magnetization on the right side of the magnetic domain wall 224 is opposite to the direction of magnetization on the left side. When flowing a current in this state from the second electrode 223 to the first electrode 222, the current crosses the magnetic domain wall 224. At that time, electrons are injected from the first electrode 222 into the ferromagnetic layer 221 to flow into the second electrode 223. The directions of spins of electrons injected into the ferromagnetic layer 221 are considered to be aligned by s-d interaction in the same direction as the direction of magnetization in the region on the left side of the magnetic domain wall 224 in the ferromagnetic layer 221 (also referred to as polarization). The magnetization due to spins of the polarized electrons is taken as Sl (a rightward vector). Then, when the spin-polarized electrons pass through the magnetic domain wall 224 and are injected into the region on the right-hand side of the magnetic domain wall 224 of the ferromagnetic layer 221, the directions of spins of electrons is to be aligned this time by s-d interaction in the same direction as the direction of magnetization opposite to the direction before the electrons pass through the magnetic domain wall 224. The magnetization due to spins of the electrons polarized on the right-hand side of the magnetic domain wall 224 is taken as Sr (a leftward vector). Moreover, the magnetization on the left-hand side of the ferromagnetic layer 224 and the magnetization on the right-hand side are taken as Ml (a rightward vector) and Mr (a leftward vector), respectively.

As was explained above, with the direction of Sr considered to be positive, in the process in which electrons move from the left-hand side to the right-hand side of the magnetic domain wall 224, magnetization Sr due to electron spin changes to Sl to result in an increase in electron spins in the negative direction. Before and after electrons cross the magnetic domain wall, the total sum (Ml+Sl+Mr+Sr) of spin angular momentum of magnetization of the magnetic material and conduction electrons is conserved to be constant. In a process in which conduction electrons on the left-hand side of the magnetic domain wall cross the magnetic domain wall, the total sum of whole spin angular momentum of electrons (Sl+Sr) increases by 2Sr (decreases by 2Sl). That is, by the conduction electrons crossing the magnetic domain wall 224 from the left-hand side to the right-hand side, the magnetization Ml of the magnetic domain wall is to go on increasing (the magnetic domain wall 224 is to go on moving in the same direction as the direction in which electrons flow).

FIGS. 22A and 22B show the difference in position of the magnetic domain wall 224 between the state before a current is made to flow from the electrode 223 and the state after a current is made to flow from the electrode 223. In this way, it is known that the magnetic domain wall 224 moves in the direction opposite to the direction in which the current flows. It is reported that the current density enabling the displacement of the magnetic domain wall is of the order of $10^8$ A/cm$^2$ in the case of metallic magnetic material such as permalloy and of the order of $8\times10^4$ A/cm$^2$ in the case of ferromagnetic semiconductor and that, by increasing a current density, the displacement speed of the magnetic domain wall becomes of the order of 3 m/s. See for example Yamaguchi's paper and Michihiko Yamanouchi, Abstract for 60th Annual Meeting Phys. Soc. Jpn., p. 27aYP-5, Mar. 27 (2005).

Each of the above-explained two technologies inverts the magnetization direction by flowing a current in the element. Its operation principle is based on the fact that, when spin-polarized electrons are injected into a ferromagnet, a torque due to electron spin is exerted on the magnetization of the ferromagnet. At this time, the total of the magnetization due to spins of the injected free electrons and the magnetization of the ferromagnet is conserved. Thus, for bringing about inversion of magnetization with a slight amount of injected electrons (or an injected current), the volume and the magnitude of saturation magnetization of the ferromagnet subjected to inversion of magnetization must be made small.

For example, in the case of the MRAM shown in FIG. 20, when its volume and its saturation magnetization are made small, a problem arises in that thermal stability of recording bit, namely thermal stability of magnetization of the recording cell 209, becomes low, causing thermal fluctuation of magnetization by thermal disturbance, even at room temperature, and making it impossible to keep the magnetization of the recording cell. Also in the arrangement shown in FIG. 21, for carrying out high speed displacement of the magnetic domain wall by a slight current, saturation magnetization must be lowered. However, lowering the magnetization saturation increases thermal fluctuation of magnetization forming the magnetic domain wall. Thus, it can be easily supposed that a problem arises in which the position of the magnetic domain wall is randomly displaced by thermal agitation.

Furthermore, with the structure shown in FIG. 21, although it is possible to induce a change in a state of magnetization, i.e., displacement of the magnetic domain wall, by supplying a current, it is difficult to detect a state of magnetization. This is because, in the case of the arrangement shown in FIG. 20, only the position of the magnetic domain wall changes without change in the length of the magnetic layer in which a current flows. Although the ratio of the length of the region magnetized rightward and the length of the region magnetized leftward changes in the ferromagnet 221, it is considered that the rightward resistivity and the leftward resistivity are the same. Therefore, the difference in the electric resistance due to change in the ratio of the lengths is in a negligible level. Hence, only with such displacement of the magnetic domain wall, there is no large change in the electric resistance between both of the electrodes.

Accordingly, there remains a need for an element in which the magnetized state of the element can be changed by flowing a current between two electrodes and changing the electric resistance between the two electrodes depending on the magnetized state of the element, to provide the element as one in which thermal stability of the magnetized state of the element is improved, while a critical current necessary for changing the magnetized state remains small. Also, there remains a need for an element in which a magnetic domain wall is displaced by flowing a current between two electrodes of a magnetic material, to provide the element as one in which the electric resistance between the two electrodes is changed by displacement of the magnetic domain wall. The present invention addresses these needs.

SUMMARY OF THE INVENTION

The present invention relates to a basic structure element forming a magnetic sensor or a magnetic memory and a device incorporating the element. More specifically, the present invention relates to an element in which electron spin injection is controlled to form a magnetic random access memory having a large capacity and including no mechanical driving section or to an element that detects electron spin injection to form a faint electric current sensor, and a device using the element.

One aspect of the present invention is a spin injection magnetic domain wall displacement element. The element can include a magnetic domain wall displacement layer having a magnetic domain wall, a first magnetic layer group having at least one ferromagnetic layer, and a second magnetic layer group having at least one ferromagnetic layer. The first magnetic layer group is disposed at one end of the magnetic domain wall displacement layer and the second magnetic layer group disposed at the other end of the magnetic domain wall displacement layer. The magnetic domain wall in the magnetic domain wall displacement layer is displaceable by flowing electrons between the first magnetic layer group and the second magnetic layer group.

At least part of the magnetic domain wall displacement layer is in contact with the first magnetic layer group and is in antiferromagnetic coupling with the first magnetic layer group, and at least part of the magnetic domain wall displacement layer is in contact with the second magnetic layer group and is in antiferromagnetic or ferromagnetic coupling with the second magnetic layer group.

In one embodiment, the first magnetic layer group and the second magnetic layer group can be disposed on different surfaces of the magnetic domain wall displacement layer and positioned opposing each other while holding the magnetic domain wall displacement layer therebetween. In another embodiment, the first magnetic layer group and the second magnetic layer group can be disposed on the same surface of the magnetic domain wall displacement layer.

The first magnetic layer group can comprise a nonmagnetic first exchange coupling control layer and a first ferromagnetic layer laminated together, with the first exchange coupling control layer in contact with the magnetic domain wall displacement layer. The first magnetic layer group can comprise a nonmagnetic first exchange coupling control layer and a first ferromagnetic layer laminated together, with the first exchange coupling control layer in contact with the magnetic domain wall displacement layer.

The second magnetic layer group can comprise a nonmagnetic intermediate exchange coupling control layer, an intermediate ferromagnetic layer, a nonmagnetic second exchange coupling control layer, and a second ferromagnetic layer laminated in this order, with the intermediate exchange coupling control layer in contact with the magnetic domain wall displacement layer.

The first magnetic layer group can comprise a nonmagnetic layer and a first ferromagnetic layer laminated together. The nonmagnetic layer can comprise a first exchange coupling control layer and a first nonmagnetic metal layer. Both the first exchange coupling control layer and the first nonmagnetic metal layer can be in contact with the magnetic domain wall displacement layer.

The second magnetic layer group can comprise a nonmagnetic layer, an intermediate ferromagnetic layer, a nonmagnetic second exchange coupling control layer and a second ferromagnetic layer being laminated in this order. The nonmagnetic layer can comprise an intermediate exchange coupling control layer and an intermediate nonmagnetic metal layer. Both the intermediate exchange coupling control layer and the intermediate nonmagnetic metal layer can be in contact with the magnetic domain wall displacement layer.

The first magnetic layer group can comprise a first exchange coupling control layer and a first ferromagnetic layer laminated together, with the first exchange coupling control layer in contact with the magnetic domain wall displacement layer.

The second magnetic layer group can comprise a nonmagnetic third exchange coupling control layer and a third ferromagnetic layer laminated together, with the third exchange coupling control layer in contact with the magnetic domain wall displacement layer.

The nonmagnetic layer of the second magnetic layer group can comprise a third exchange coupling control layer and a third nonmagnetic metal layer. Both the third exchange coupling control layer and the third nonmagnetic metal layer are in contact with the magnetic domain wall displacement layer.

The second magnetic layer group can comprise a fourth ferromagnetic layer.

The film thickness of the intermediate ferromagnetic layer can be smaller than the spin relaxation length of electrons in the intermediate ferromagnetic layer.

Another aspect of the present invention is a spin injection magnetic domain wall displacement device comprising a plurality of the spin injection magnetic domain wall displacement elements described above. The device can carry out writing and reading based on the difference in electric resistance.

DETAILED DESCRIPTION

Figure 1:
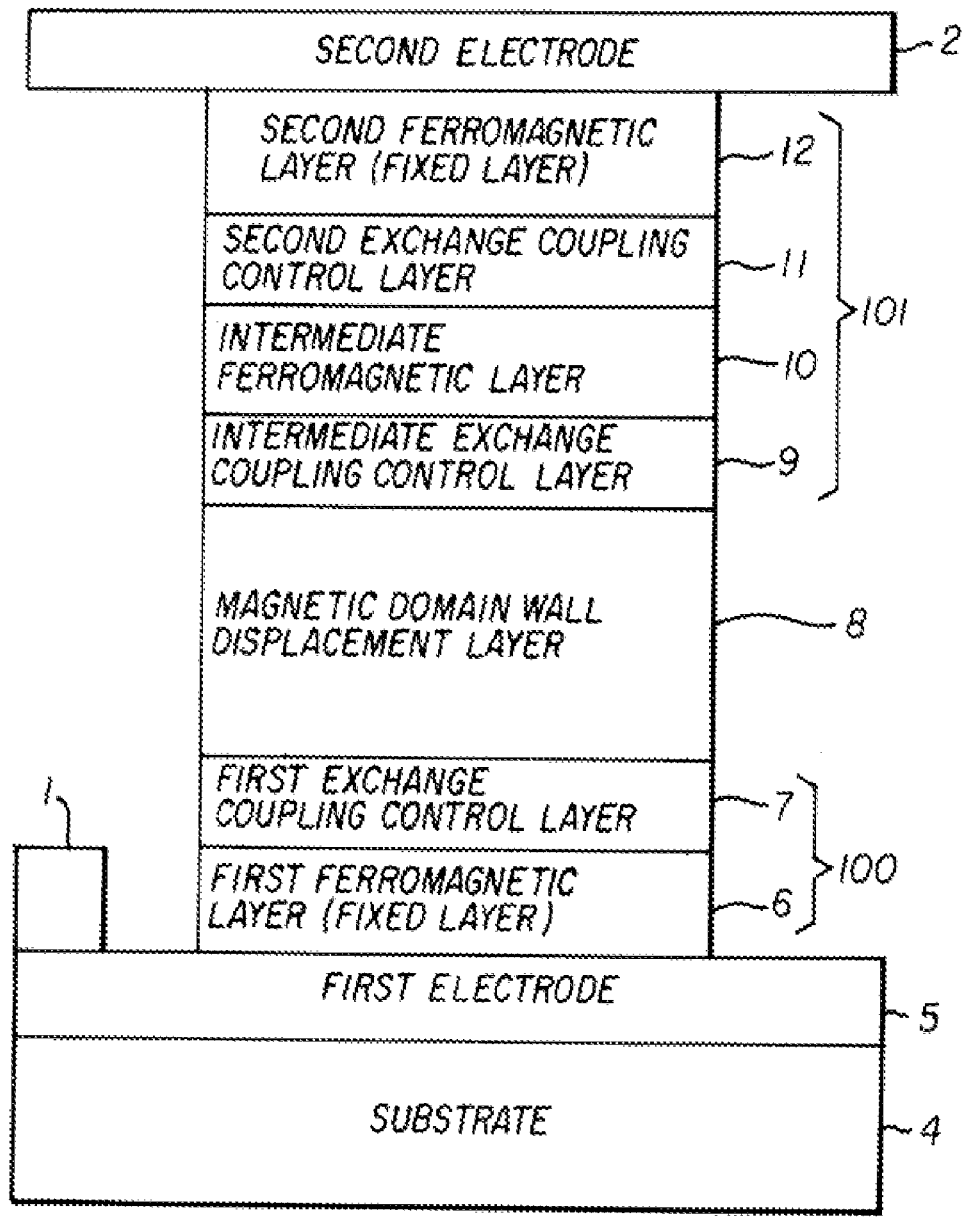
FIG. 1 is a schematic cross sectional view for explaining an example of the basic arrangement of a first embodiment of a spin injection magnetic domain wall displacement element according to the invention.

FIG. 1 is a schematic cross sectional view for explaining an example of the basic arrangement of a first embodiment of a spin injection magnetic domain wall displacement element according to the invention. On a substrate 4, there are formed in the order a first electrode 5, a first magnetic layer group 100, a magnetic domain wall displacement layer 8, a second magnetic layer group 101 and a second electrode 2. Further, a bit line 1 is formed on the first electrode 5. The first magnetic layer group 100 is formed of a first ferromagnetic layer 6 and a first exchange coupling control layer 7. The second magnetic layer group 101 is formed of an intermediate exchange coupling control layer 9, an intermediate ferromagnetic layer 10, a second exchange coupling control layer 11 and a second ferromagnetic layer 12. The arrangement shown in FIG. 1 is the minimum unit of the element and the necessary number of the elements are disposed on the same substrate to form a desired device. Circuits and driving elements for driving the elements according to the invention can be also arranged on the same substrate.

Figure 2A:
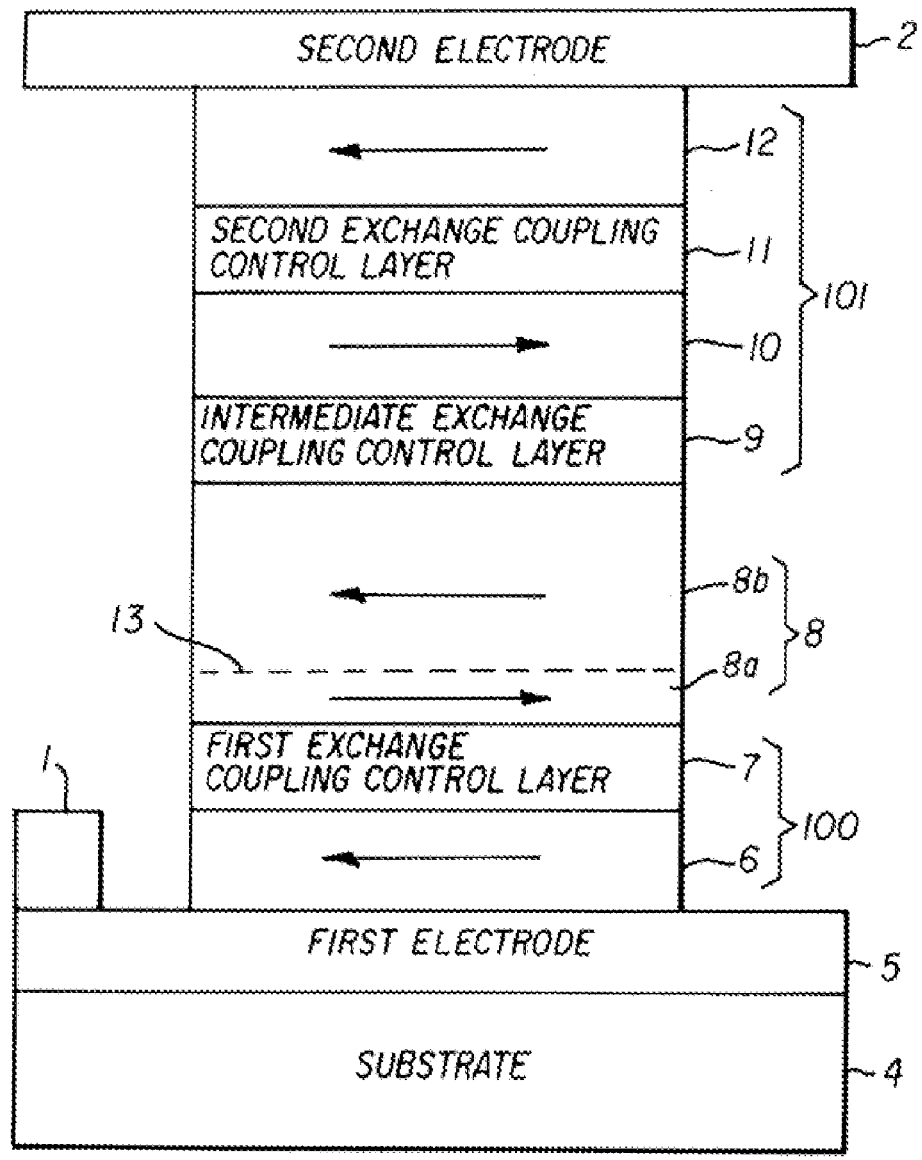
FIG. 2A illustrates FIG. 1 in an initialized state for explaining the operation principle thereof.
Figure 2B:
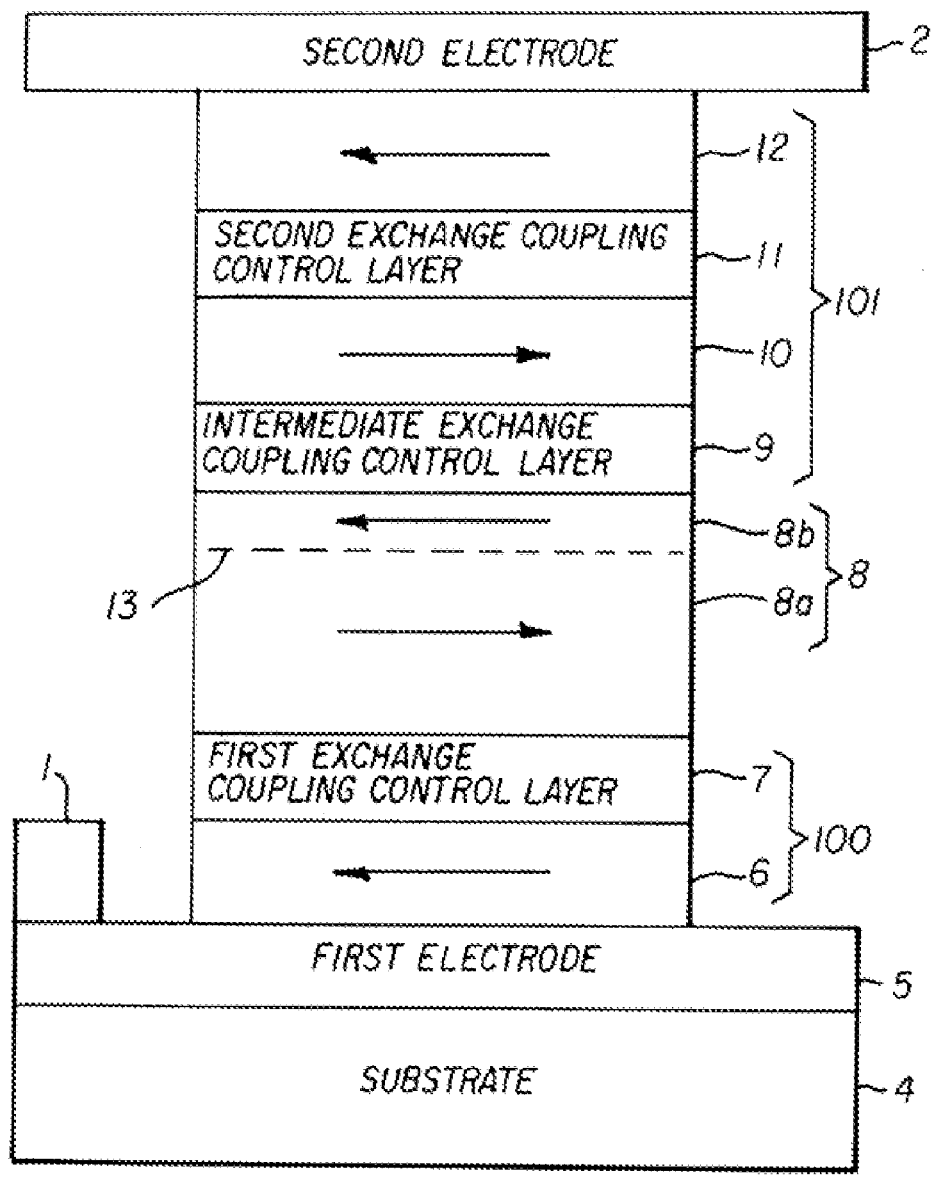
FIG. 2B illustrates FIG. 2A in a state when a current flows from a second electrode to a first electrode in the element in the state shown in FIG. 2A for explaining the operation principle of the element of FIG. 1.

FIGS. 2A and 2B illustrate FIG. 1 in different states for explaining the operation principle of the first embodiment. In each of the magnetic layers in the element shown in FIG. 1, the direction of magnetization thereof is shown with an arrow. The magnetic domain wall displacement layer 8 is divided by a magnetic domain wall 13 into a magnetic domain wall displacement layer 8a on the first electrode 5 side and a magnetic domain wall displacement layer 8b on the second electrode 2 side.

The material for the substrate 4 can be selected as required depending on the desired flatness when the material has an insulation property for individually controlling a plurality of the elements arranged on the substrate and has sufficient rigidity for holding the elements. For example, an insulating substrate of sapphire or silicon oxide with a thickness of several hundreds of micrometers or a semiconductor substrate whose surface is oxidized to ensure insulating property can be used.

The material of the first electrode 5 can be selected as required when it is a conductive material. The thickness thereof is preferably within the range from several tens of nanometers to several hundreds of nanometers and its area is preferably within the range from 50 nm×50 nm to 1000 nm×1000 nm. Moreover, the shape thereof is preferably a rectangle, but can be a circle or an oval as desired.

The first ferromagnetic layer 6 and the first exchange coupling control layer 7 are for providing antiferromagnetic coupling between the first ferromagnetic layer 6 and the magnetic domain wall displacement layer 8a on the first electrode 5 side in part of the magnetic domain wall displacement layer 8. By the antiferromagnetic coupling thus provided, the direction of magnetization of the magnetic domain wall displacement layer 8a on the first electrode 5 side is fixed in the direction opposite to the direction of the magnetization of the first ferromagnetic layer 6.

The material of the first ferromagnetic layer 6 can be selected as necessary from materials having ferromagnetism. For example, alloys such as a Co alloy, a CoPt alloy, a CoPtCr alloy, and a CoCr alloy can be used. During the operation of the element, the magnetization of the first ferromagnetic layer 6 is preferably fixed in one direction. Thus, the first ferromagnetic layer 6 has preferably a high coercive force and a large film thickness. The coercive force is preferably from 2000 to 4000 Oe and the thickness is preferably from 50 nm to 200 nm. Moreover, for the material thereof, an ordered alloy such as $Co_{50}Pt_{50}$ is particularly preferable. This is because some ordered alloys are known to have magnetic anisotropy constants Ku exceeding $1\times10^7$ erg/cm². With such alloys, the direction of magnetization can be kept stably.

The first exchange coupling control layer 7 is a nonmagnetic layer for separating the first ferromagnetic layer 6 and the magnetic domain wall displacement layer 8 with a specified clearance to control an exchange coupling constant in the exchange coupling between the first ferromagnetic layer 6 and the magnetic domain wall displacement layer 8a on the first electrode 5 side. The material thereof is preferably Ru, V, C, Nb, Mo, Rh, Ta, W, Re, Ir, Pt, or Pd, or an alloy with the main ingredient being any one of the elements. The exchange coupling constant changes from positive value to negative value depending on the thickness of the first exchange coupling control layer 7. Consequently, the thickness of the first exchange coupling control layer 7 is selected so that antiferromagnetic coupling is provided between the first ferromagnetic layer 6 and the magnetic domain wall displacement layer 8a on the first electrode 5 side. However, an excessive thickness of the first exchange coupling control layer 7 creates a weak exchange coupling. Therefore, the thickness is preferably determined as being from 0.5 to 3 nm. For example, in the case in which the first ferromagnetic layer 6 is made of a CoPt alloy, the first exchange coupling control layer 7 is made of Ru and the magnetic domain wall displacement layer 8 is made of a CoHfTa alloy, an antiferromagnetic coupling can be provided with the film thickness of Ru made at 0.8 nm and a ferromagnetic coupling can be provided with the film thickness of Ru made at 1.8 nm.

The magnetic domain wall displacement layer 8 is a layer that makes the electric resistance of the whole element shown in FIG. 1 change depending on the position of the magnetic domain wall 13 formed in the layer and brings about hysteresis. The detailed explanation of the operation thereof will be given later. The material can be any magnetic material with a magnetic domain wall presented therein, for which a material such as magnetic metal, ferromagnetic semiconductor or ferromagnetic oxide can be used. This is preferably a material such as permalloy, a CoFe alloy, a CoFeB alloy, a NiCoFe alloy, a CoCrFeAl alloy, Fe, a FePt alloy, a NiMnSb alloy, a CoMn group alloy, $Sr_2FeMoO_6$, $Fe_2O_3$, or CoHfTa. Particularly preferable is permalloy, $Co_{90}Fe_{10}$, $Co_2MnAl$, $Co_2MnSi$, or $Co_2MnGe$. The film thickness thereof is preferably from 50 nm to 500 nm. It is necessary for the direction of magnetization of the magnetic domain wall displacement layer 8a on the first electrode 5 side to be easily controlled depending on the direction of magnetization of the first ferromagnetic layer 6, or for the direction of magnetization of the magnetic domain wall displacement layer 8b on the second electrode 2 side to be easily controlled depending on the direction of magnetization of the second ferromagnetic layer 12. Therefore, the coercive force of the magnetic domain wall displacement layer 8 is preferably equal to 10 Oe or less.

The intermediate exchange coupling control layer 9, the intermediate ferromagnetic layer 10, the second exchange coupling control layer 11, and the second ferromagnetic layer 12 are for providing antiferromagnetic coupling between the second ferromagnetic layer 12 and the intermediate ferromagnetic layer 10, and between the intermediate ferromagnetic layer 10 and the magnetic domain wall displacement layer 8b on the second electrode 2 side. By the antiferromagnetic coupling thus provided, the direction of magnetization of the magnetic domain wall displacement layer 8b on the second electrode 2 side is fixed in the same direction as the direction of the magnetization of the second ferromagnetic layer 12. Furthermore, by adequately controlling the film thickness of the intermediate ferromagnetic layer 10, spins of injected electrons can be controlled.

The intermediate exchange coupling control layer 9 is a nonmagnetic layer for separating the intermediate ferromagnetic layer 10 and the magnetic domain wall displacement layer 8 with a specified clearance to control an exchange coupling constant in the exchange coupling between the intermediate ferromagnetic layer 10 and the magnetic domain wall displacement layer 8b on the second electrode 2 side. The material and the film thickness of the intermediate exchange coupling control layer 9 is determined similarly to those for the first exchange coupling control layer 7.

The intermediate ferromagnetic layer 10 is for providing the above antiferromagnetic coupling as well as for injecting electrons into the adjacent layer with the spins of injected electrons being conserved. For example, electrons injected from the intermediate exchange coupling control layer 9 pass through the intermediate ferromagnetic layer 10 and are injected into the second exchange coupling control layer 11 with respective polarized states of electron spins almost being conserved. The directions of polarized electron spins are conserved for a length of several times the mean free path of the electrons. The polarized states of electron spins, however, are soon relaxed and the directions of electron spins are to become aligned in the direction of magnetization of the magnetic layer through which the electrons are passing. Therefore, the film thickness of the intermediate ferromagnetic layer 10 must be made smaller compared with the relaxation length of electron spin. Since the relaxation length of electron spin is from 100 to 200 nm in metal, the film thickness of the intermediate ferromagnetic layer 10 is then preferably 50 nm or less. For well conserving the polarized state of electron spin, the film thickness between 5 nm and 20 nm is particularly preferable. Moreover, the direction of magnetization of the intermediate ferromagnetic layer 10 must be easily controlled by the magnetization of the second ferromagnetic layer 12. Thus, the material of the intermediate ferromagnetic layer 10 is preferably provided as a material having a smaller coercive force compared with the material of the second ferromagnetic layer 12. Thus, materials such as a CoHfTa alloy, a CoZrNb alloy, a CoFe alloy, a FeCoN alloy, a FeAlN alloy, a $Ni_{45}Fe_{55}$ alloy, a $Ni_{81}Fe_{19}$ alloy, a NiFeMo alloy, and a FeTaN alloy are preferable. Furthermore, the coercive force is preferably provided as 20 Oe or less.

The second exchange coupling control layer 11 is a nonmagnetic layer for separating the intermediate ferromagnetic layer 10 and the second ferromagnetic layer 12 with a specified clearance to control an exchange coupling constant in the exchange coupling between the intermediate ferromagnetic layer 10 and the second ferromagnetic layer 12. The material and the film thickness of the second exchange coupling control layer 11 is determined similarly to those for the first exchange coupling control layer 7.

The material of the second ferromagnetic layer 12 can be selected as necessary from materials having ferromagnetism. For example, alloys such as a Co alloy, a CoPt alloy, a CoPtCr alloy and a CoCr alloy can be used. During the operation of the element, the magnetization of the second ferromagnetic layer 12 is preferably fixed in one direction. Thus, the second ferromagnetic layer 12 has preferably a high coercive force and a large film thickness. The coercive force is preferably from 2000 to 4000 Oe and the thickness is preferably from 50 nm to 200 nm. Moreover, for the material thereof, an ordered alloy such as $Co_{50}Pt_{50}$ is particularly preferable.

The material of the second electrode 2 can be selected as required when it is a conductive material. The thickness thereof is preferably within the range from several tens of nanometers to several hundreds of nanometers and its area is preferably within the range from 50 nm×50 nm to 1000 nm×1000 nm. Moreover, the shape thereof is preferably a rectangle, but can be a circle or an oval as desired.

The bit line 1 is a wire for supplying a desired voltage to the first electrode 5 for which commonly used wiring materials, such as Al and Cu, can be used.

The area of each of the layers from the first ferromagnetic layer 6 to the second ferromagnetic layer 12 is preferably made a little smaller than the area of each of the electrodes to be preferably within the range from 50 nm×50 nm to 300 nm×300 nm.

Each of the layers from the first electrode 5 to the second electrode 2 and the bit line 1 can be formed by a known deposition method for which methods such as sputtering, CVD, and evaporation can be used.

Figure 20:
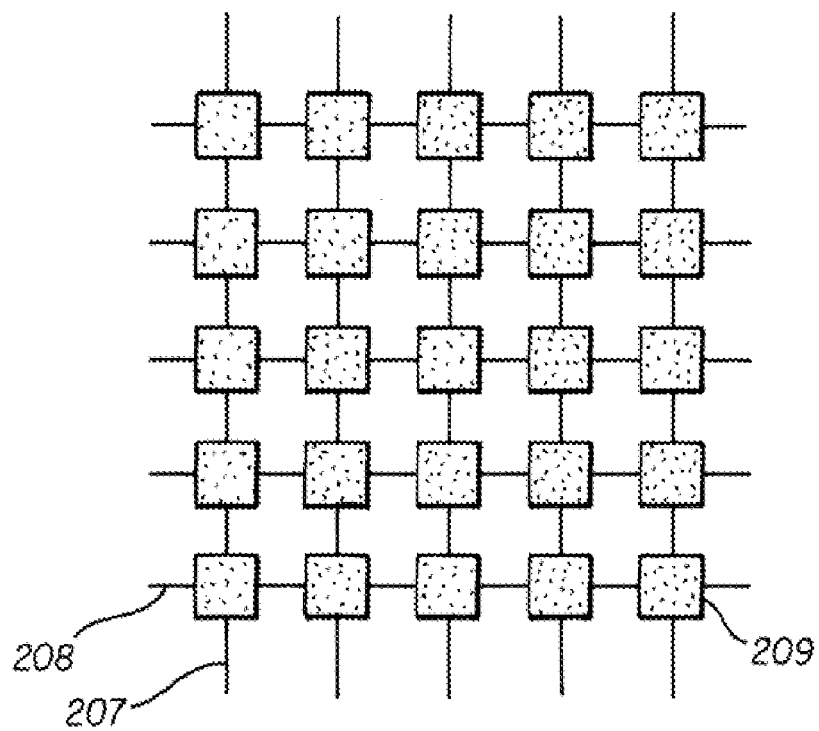
FIG. 20 is a schematic view showing a planar structure of an MRAM in which a plurality of GMR elements shown in FIG. 18 are connected.

With the element disposed as a vertical element at each position of the recording cell 209 in FIG. 20 and connected to the word line 208 and the bit line 207, an integrated magnetic memory can be formed.

Figure 21:
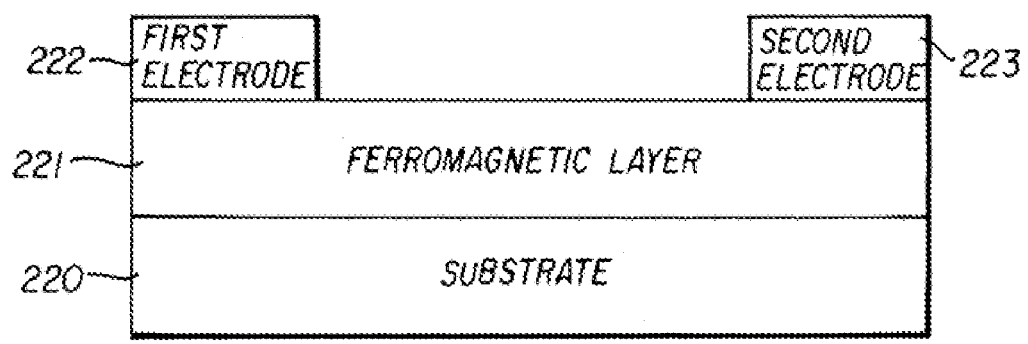
FIG. 21 is a schematic cross sectional view showing an arrangement of a related magnetic domain wall displacement element.
Figure 22A:
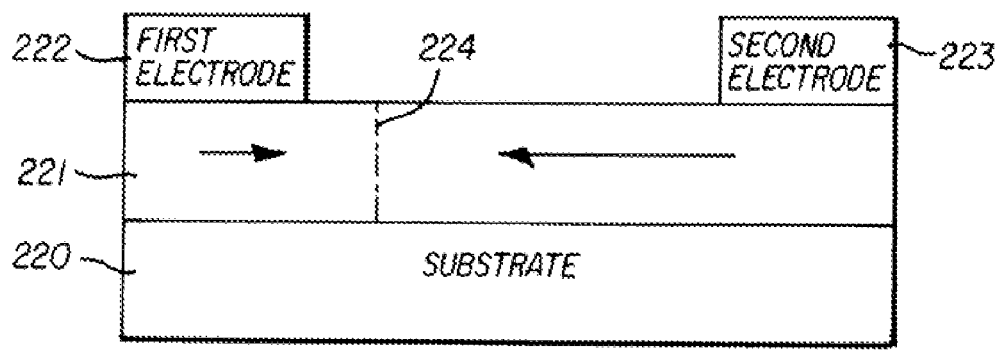
FIG. 22A illustrates FIG. 21 in an initialized state for explaining the principle of displacement of a magnetic domain wall in the element shown in FIG. 21.
Figure 22B:
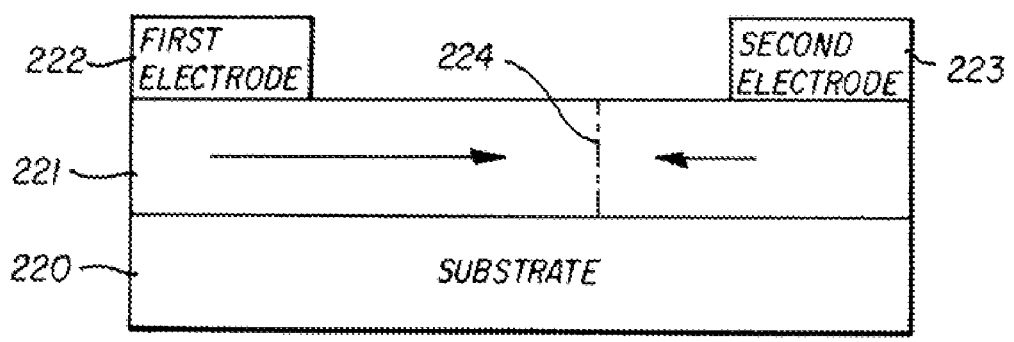
FIG. 22B is a schematic cross sectional view illustrates FIG. 22A in a state when a current is made to flow from a second electrode to a first electrode in the element in the state shown in FIG. 22A for explaining the principle of displacement of a magnetic domain wall in the element of FIG. 21.

The operation principle of the element according to the first embodiment now follows, referring to FIGS. 2A and 2B. First, the operation principle for carrying out writing or recording in the element will be explained. Referring to FIG. 2A, the element is initialized first. Here, the element is in a magnetized state when a strong leftward magnetic field equivalent to a saturation magnetic field is applied to the element to provide leftward magnetization of all of the first ferromagnetic layer 6 and the second ferromagnetic layer 12 before the magnetic field is removed. Antiferromagnetic coupling is provided between the first ferromagnetic layer 6 and the magnetic domain wall displacement layer 8a on the first electrode 5 side, and the coercive force of the first ferromagnetic layer 6 is higher than the coercive force of the magnetic domain wall displacement layer 8. This causes rightward magnetization, becoming opposite to the direction of magnetization of the first ferromagnetic layer 6, to be induced in the magnetic domain wall displacement layer 8a on the first electrode 5 side. Moreover, an antiferromagnetic coupling is provided between the second ferromagnetic layer 12 and the intermediate ferromagnetic layer 10, and the coercive force of the second ferromagnetic layer 12 is higher than the coercive force of the intermediate ferromagnetic layer 10. This causes rightward magnetization, opposite to the direction of magnetization of the second ferromagnetic layer 12, to be induced in the intermediate ferromagnetic layer 10. Furthermore, an antiferromagnetic coupling is provided between the intermediate ferromagnetic layer 10 and the magnetic domain wall displacement layer 8b on the second electrode 2 side. This causes leftward magnetization, becoming opposite to the direction of magnetization of the intermediate ferromagnetic layer 10, to be induced in the magnetic domain wall displacement layer 8b on the second electrode 2 side. Therefore, the directions of magnetization induced in the magnetic domain wall displacement layers 8a and 8b are to be invariably opposite to each other. Since the coercive force of the magnetic domain wall displacement layer 8 is small, a plurality of magnetic domain walls are produced in some cases. However, by letting a current flow from the first electrode 5 to the second electrode 2 on the basis of the principle explained with reference to FIGS. 21, 22A, and 22B, the magnetic domain walls can be concentrated to the position of the magnetic wall 13 shown in FIG. 2A. Moreover, in the magnetic domain wall displacement layer 8a on the first electrode 5 side, by the antiferromagnetic coupling with the first ferromagnetic layer 6, magnetization in the direction opposite to the direction of magnetization of the first ferromagnetic layer 6 is invariably induced. Thus, even in the case of letting a current continuously flow from the first electrode 5 to the second electrode 2, one stable magnetic domain wall can be formed in the magnetic domain wall displacement layer 8.

In the element in the state as shown in FIG. 2A, a current made to continuously flow from the second electrode 2 toward the first electrode 5 causes the magnetic domain wall 13 to displace in the direction opposite to the direction of the current, by which the magnetic domain wall disposition as shown in FIG. 2B is presented. When the current flow is stopped, the antiferromagnetic coupling between the intermediate ferromagnetic layer 10 and the magnetic domain wall displacement layer 8b on the second electrode 2 side causes magnetization in the direction opposite to the direction of magnetization of the intermediate ferromagnetic layer 10 to be invariably induced in the magnetic domain wall displacement layer 8b on the second electrode 2 side. Therefore, one stable magnetic domain wall is formed in the magnetic domain wall displacement layer 8 without disappearance. Moreover, by letting a sufficient amount of current flow, the thickness of the magnetic domain wall displacement layer 8b on the second electrode 2 side can be made sufficiently smaller compared with electron spin relaxation length. For example, the thickness can be made on the order of 20 nm.

In the element in the state as shown in FIG. 2B, a current made to continuously flow from the first electrode 5 toward the second electrode 2 causes an operation carried out in reverse to the foregoing, by which the element is brought to the state as shown in FIG. 2A. Moreover, by letting a sufficient amount of current flow, the thickness of the magnetic domain wall displacement layer 8a on the first electrode 5 side can be made sufficiently smaller compared with electron spin relaxation length. For example, the thickness can be made on the order of 20 nm.

In this way, by reversing the direction of current, the magnetic domain wall 13 can be freely positioned at either end section of the magnetic domain wall displacement layer 8.

The operation principle for reading out a record or detecting a state of magnetization in the element follows below. The operation principle is based on the fact that the behavior of electron spin differs depending on the relative relation between the thickness of a magnetic layer and an electron spin relaxation length. More specifically, the principle is based on the following understanding. When the thickness of a magnetic layer is sufficiently smaller compared with the electron spin relaxation length, electrons pass through the magnetic layer with most of their spins being conserved. While, when the thickness of the magnetic layer is equivalent to or more than the electron spin relaxation length, electrons pass through the magnetic layer with their spins made polarized by the magnetization of the magnetic layer.

In the following, a method of detecting difference in electric resistance of an element will be explained by flowing a detecting current from the second electrode 2 to the first electrode 5 (namely, the case of injecting electrons from the first electrode 5 toward the second electrode 2) for the element shown in FIG. 1 taken as an example. In the state shown in FIG. 2A, electrons flow in the following path (Electron path 1): the first electrode 5—the thick first ferromagnetic layer 6 in the leftward magnetized state—the nonmagnetic first exchange coupling control layer 7—the thin magnetic domain wall displacement layer 8a with the leftward magnetized state being induced therein—the thick magnetic domain wall displacement layer 8b in the leftward magnetized state—the nonmagnetic intermediate exchange coupling control layer 9—the thin intermediate ferromagnetic layer 10 in the rightward magnetized state—the nonmagnetic second exchange coupling control layer 11—the thick second ferromagnetic layer 12 in the leftward magnetized state—the second electrode 2. Here, the case where a film thickness is equivalent to or greater compared with the electron spin relaxation length is expressed as being "thick", and the case where a film thickness is sufficiently smaller compared with the electron spin relaxation length is expressed as being "thin". A thin film thickness is that of the order of 20 nm, for example, and a thick film thickness is that of the order of 200 nm, for example.

In the state shown in FIG. 2B, electron flows in the following path (Electron path 2) (the meaning of the expressions of "thick" and "thin" are the same as that in the foregoing): the first electrode 5—the thick first ferromagnetic layer 6 in the leftward magnetized state—the nonmagnetic first exchange coupling control layer 7—the thick magnetic domain wall displacement layer 8a in the rightward magnetized state—the thin magnetic domain wall displacement layer 8b with the leftward magnetized state being induced therein—the nonmagnetic intermediate exchange coupling control layer 9—the thin intermediate ferromagnetic layer 10 in the rightward magnetized state—the nonmagnetic second exchange coupling control layer 11—the thick second ferromagnetic layer 12 in the leftward magnetized state—the second electrode 2.

The spin-polarized electrons are scattered or reflected at an interface with a magnetic material magnetized in the direction different from the direction of the spins of the electrons to cause an increase in electric resistance. Moreover, when the electrons pass through a thick magnetic layer, the directions of the spins of electrons are to be polarized in the direction of the magnetization of the magnetic material.

Comparison will be made between the electron path 2 and the electron path 1. In the electron path 2, electrons with their spins polarized in the direction of the leftward magnetization (here, this is considered as the down-spin) in the first ferromagnetic layer 6 by s-d interaction are largely scattered or reflected at the interface with the thick magnetic domain wall displacement layer 8a to thereby cause an increase in electric resistance. However, the electrons with down-spins injected into the magnetic domain wall displacement layer 8a are this time brought to be polarized by s-d interaction to be electrons with up-spins, spins in the direction of the magnetization of the thick magnetic domain wall displacement layer 8a. The electrons with the up-spins, when injected into the thin magnetic domain wall displacement layer 8b, are to be weakly scattered or reflected at the interface. Since the magnetic domain wall displacement layer 8b is thin, the electrons with up-spins injected into the thin magnetic domain wall displacement layer 8b, with their spins being kept polarized in up-spins, reach the intermediate ferromagnetic layer 10 whose direction of magnetization is the same as the direction of the up-spin. As a result, at the interface with the intermediate ferromagnetic layer 10, the electrons are subjected to no large scattering and reflection. Furthermore, the electrons pass through the thin intermediate ferromagnetic layer 10 with up-spins being kept unchanged and are to be largely reflected and scattered at the interface with the thick second ferromagnetic layer 12.

While, in the electron path 1, electrons with their spins polarized in the down-spin, in the direction of the leftward magnetization, in the first ferromagnetic layer 6 by s-d interaction are subjected to weak scattering or reflection at the interface with the thin magnetic domain wall displacement layer 8a. However, since the magnetic domain wall displacement layer 8a, having the direction of magnetization being different from the direction of the down-spin, is thin, the electrons are allowed to keep their down-spins and pass through the magnetic domain wall displacement layer 8b with their down-spins being kept to reach the intermediate ferromagnetic layer 10 with the direction of magnetization being different from the direction of the down-spin. At the interface with the intermediate ferromagnetic layer 10, the electrons are subjected to weak scattering or reflection. However, the thin intermediate ferromagnetic layer 10 allows the electrons to reach up to the second ferromagnetic layer 12 having the direction of magnetization being the same as the direction of the down-spin with the down-spins of the electrons being kept unchanged.

When electrons are injected into a magnetic film, to electrons having spins with the directions different from the direction of magnetization in the magnetic film, there exists a potential barrier at the interface of the magnetic film. Therefore, the electrons are scattered or reflected by the potential barrier. The case in which electrons are largely scattered or reflected by a potential barrier at an interface to largely increase electric resistance is the case in which sufficiently spin-polarized electrons are injected into a thick magnetic material magnetized in the direction different from the directions of spin angular momentum of the electrons. That is, a combination of directions of magnetization of thick magnetic layers largely contributes to spin-dependent conduction. More specifically, electric resistance of the element largely changes depending on whether the directions of magnetization of thick magnetic layers are in an antiparallel state or in a parallel state. However, influence that the direction of magnetization of a thin magnetic layer between thick magnetic layers has on electric resistance is small.

A comparison with only combinations of the directions of magnetization of thick magnetic layers extracted from the electron paths 1 and 2 is as follows. In electron path 1: the thick first ferromagnetic layer 6 in the leftward magnetized state—the thick magnetic domain wall displacement layer 8b in the leftward magnetized state—the thick second ferromagnetic layer 12 in the leftward magnetized state. In electron path 2: the thick first ferromagnetic layer 6 in the leftward magnetized state—the thick magnetic domain wall displacement layer 8a in the rightward magnetized state—the thick second ferromagnetic layer 12 in the leftward magnetized state.

In the electron path 2, electrons with their spins polarized leftward in the first ferromagnetic layer 6 by s-d interaction are injected into the thick magnetic domain wall displacement layer 8a magnetized rightward. Furthermore, electrons with their spins polarized rightward in the magnetic domain wall displacement layer 8a by s-d interaction are to be injected into the second ferromagnetic layer 12 magnetized leftward. Thus, the electrons are injected two times into layers with directions of magnetization different from each other. While, in the electron path 1, electrons with their spins polarized leftward in the first ferromagnetic layer 6 by s-d interaction are injected into the thick magnetic domain wall displacement layer 8a and second ferromagnetic layer 12 both being similarly magnetized leftward. Thus, the electrons are not subjected to so large scattering or reflection. Therefore, the electric resistance of the electron path 2 becomes higher than the electric resistance of the electron path 1. Consequently, by measuring electric resistance across the electrodes, the state of internal magnetization of the element can be easily detected.

In the foregoing, the explanation related to a method of separately detecting two magnetized states, which method becomes effective particularly in a memory element. However, continuous detection of magnetized state is also possible. When electrons pass through a magnetic layer with the direction of magnetization different from the directions of electron spins, the electron spins continuously change until the directions of electron spins are aligned with the direction of magnetization of the magnetic layer. Namely, the degree of polarization of electron spins differs depending on the length along which the electrons pass, and the electric resistance in a magnetic layer into which the electrons are injected next is to change depending on the degree of polarization of electron spins. More specifically, depending on the position of the magnetic domain wall 13 in the magnetic domain wall displacement layer 8, the electric resistance from the first electrode 5 to the second electrode 2 changes continuously. Since the position of the magnetic domain wall 13 depends on the value of a current flowed in the element, by detecting the electric resistance of the element, realization of detection of a flowed current becomes possible. Moreover, stepwise classification of the change in electric resistance also enables multi-value recording of the resistance.

The arrangement shown in FIG. 1 can be modified as necessary within the range without departing from the gist of the invention. For example, antiferromagnetic coupling can be changed to ferromagnetic coupling. In the following, more specific explanations will be presented.

Figure 3:
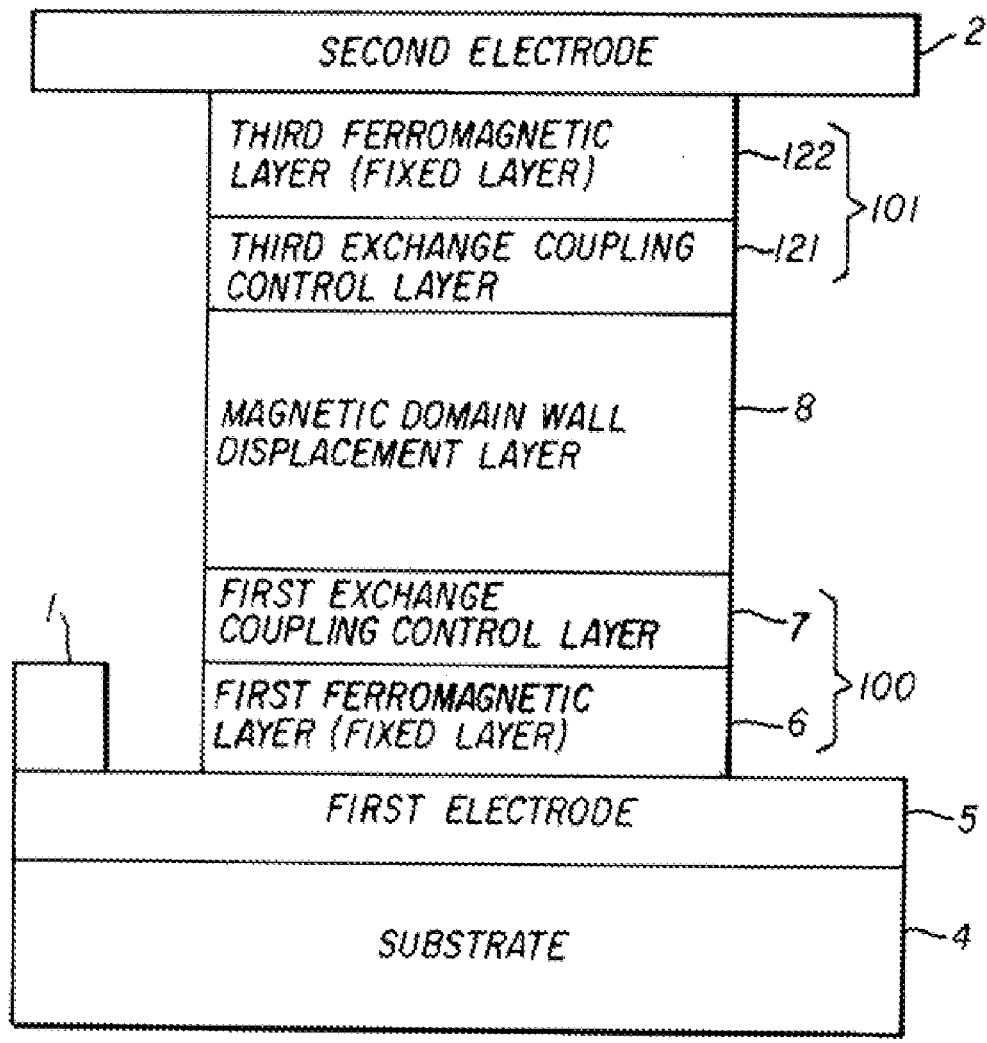
FIG. 3 is a schematic cross sectional view for explaining an example of another arrangement of the first embodiment of the spin injection magnetic domain wall displacement element according to the invention.

FIG. 3 is a schematic cross sectional view for explaining an example of another arrangement of the first embodiment of the spin injection magnetic domain wall displacement element according to the invention. On a substrate 4, there are formed in the order a first electrode 5, a first magnetic layer group 100, a magnetic domain wall displacement layer 8, a second magnetic layer group 101, and a second electrode 2. Further, a bit line 1 is formed on the first electrode 5. The first magnetic layer group 100 is formed of a first ferromagnetic layer 6 and a first exchange coupling control layer 7. The second magnetic layer group 101 is formed of a third exchange coupling control layer 121 and a third ferromagnetic layer 122.

Figure 4A:
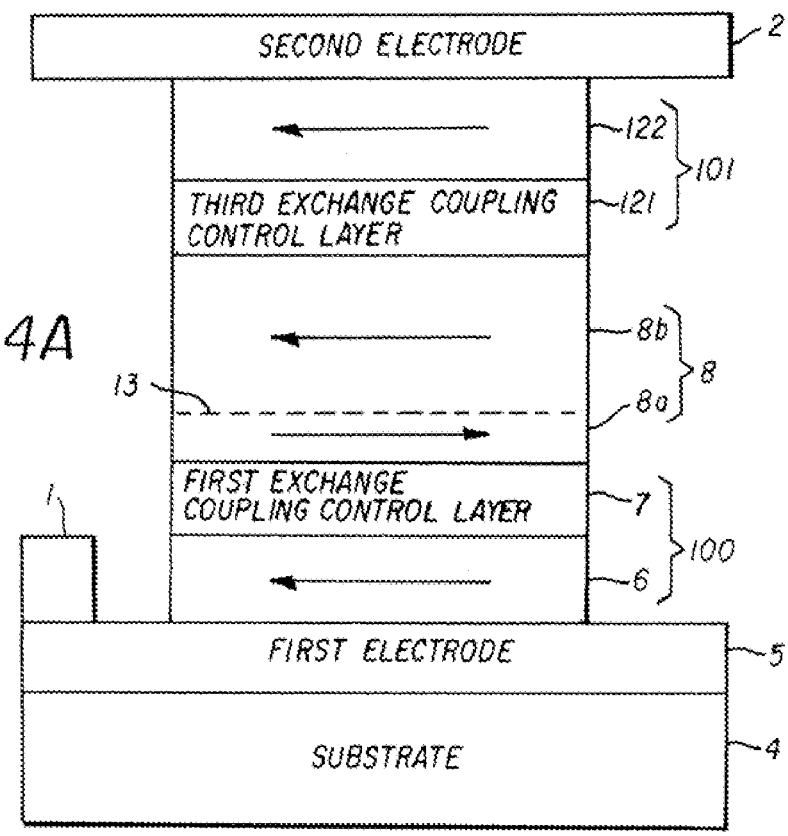
FIG. 4A illustrates FIG. 3 in an initialized state for explaining the operation principle thereof.
Figure 4B:
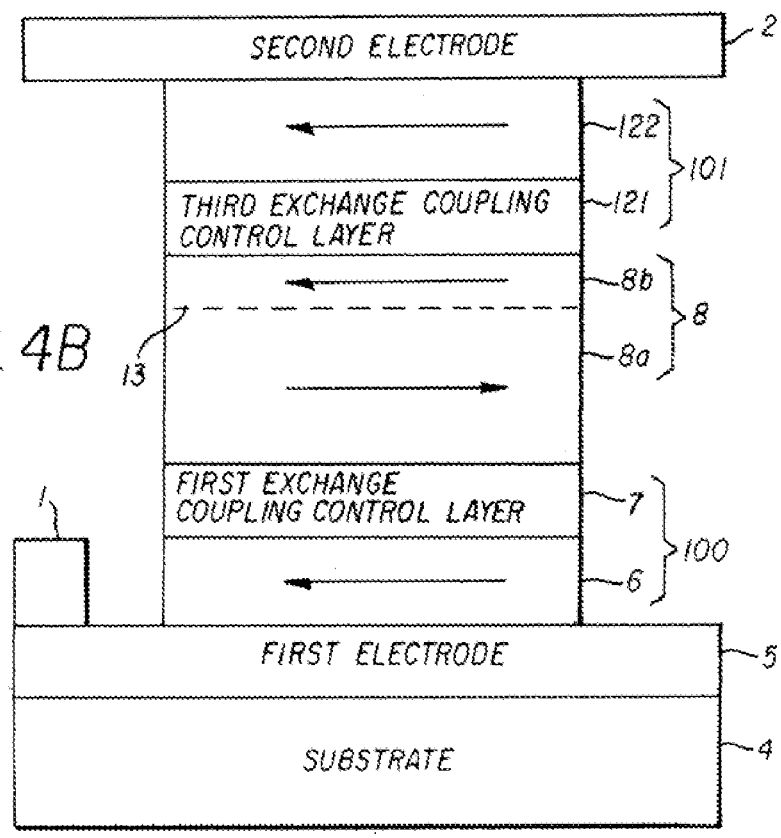
FIG. 4B illustrates FIG. 4A in a state when a current is made to flow from a second electrode to a first electrode in the element in the state shown in FIG. 4A for explaining the operation principle of the element of FIG. 3.

FIGS. 4A and 4B are for explaining the operation principle of the element of FIG. 3. In each of the magnetic layers in the element shown in FIG. 3, the direction of magnetization thereof is shown with an arrow. The magnetic domain wall displacement layer 8 is divided by a magnetic domain wall 13 into a magnetic domain wall displacement layer 8a on the first electrode 5 side and a magnetic domain wall displacement layer 8b on the second electrode 2 side. The substrate 4, the first electrode 5, the first ferromagnetic layer 6, the first exchange coupling control layer 7, the second electrode 2 and the bit line 1 are arranged similarly to those in the element shown in FIG. 1.

The magnetic domain wall displacement layer 8 differs from that in the element shown in FIG. 1 in a method of controlling the magnetic domain wall displacement layer 8b on the second electrode 2 side. However, the material, the film thickness and the magnetic characteristic thereof are provided similarly to those of the element shown in FIG. 1.

The third exchange coupling control layer 121 and the third ferromagnetic layer 122 are for providing ferromagnetic coupling between the third ferromagnetic layer 122 and the magnetic domain wall displacement layer 8b on the second electrode 2 side. By the ferromagnetic coupling thus provided, the direction of magnetization of the magnetic domain wall displacement layer 8b on the second electrode 2 side is fixed in the same direction as the direction of the magnetization of the third ferromagnetic layer 122.

The third exchange coupling control layer 121 is a non-magnetic layer for separating the magnetic domain wall displacement layer 8 and the third ferromagnetic layer 122 with a specified clearance to control an exchange coupling constant in the exchange coupling between the magnetic domain wall displacement layer 8b on the second electrode 2 side and the third ferromagnetic layer 122. The material of the third exchange coupling control layer 121 is determined similarly to that for the first exchange coupling control layer 7. Moreover, the film thickness thereof is determined so that ferromagnetic coupling is provided between the magnetic domain wall displacement layer 8b on the second electrode 2 side and the third ferromagnetic layer 122.

The material of the third ferromagnetic layer 122 can be selected as necessary from materials having ferromagnetism. For example, alloys such as a Co alloy, a CoPt alloy, a CoPtCr alloy, and a CoCr alloy can be used. During the operation of the element, the magnetization of the third ferromagnetic layer 122 is preferably fixed in one direction. Thus, the third ferromagnetic layer 122 has preferably a high coercive force and a large film thickness. The coercive force is preferably from 2000 to 4000 Oe and the thickness is preferably from 50 nm to 200 nm.

The area of each of the layers from the first ferromagnetic layer 6 to the third ferromagnetic layer 122 is preferably made a little smaller than the area of each of the electrodes to be preferably within the range from 50 nm×50 nm to 300 nm×300 nm.

Each of the layers from the first electrode 5 to the second electrode 2 and the bit line 1 can be formed by a known deposition method for which methods such as sputtering, CVD, and evaporation can be used.

The operation principle is the same as that of the element shown in FIG. 1. Writing is carried out on the basis that the magnetic domain wall 13 can be displaced to positions such as those shown in FIGS. 4A and 4B depending on the direction of the current supplied between the first electrode 5 and the second electrode 2. When a sufficient amount of the current is made to flow from the first electrode 5 to the second electrode 2, the magnetized state becomes as that shown in FIG. 4A, in which the thickness of the magnetic domain wall displacement layer 8a on the first electrode 5 side can be made sufficiently smaller than the electron-spin relaxation length to be on the order of, for example, 20 nm. Conversely, when the current is made to flow from the second electrode 2 to the first electrode 5, the magnetized state becomes as that shown in FIG. 4B, in which the thickness of the magnetic domain wall displacement layer 8b on the second electrode 2 side can be made sufficiently smaller than the electron-spin relaxation length to be on the order of, for example, 20 nm.

Reading is carried out on the basis that the electric resistance of the element is largely changed depending on whether the states of magnetization of the thick magnetic layers are in antiparallel or in parallel and an influence of the magnetization of the thin magnetic layer between the thick magnetic layers on the electric resistance is small. In the case of the magnetized state shown in FIG. 4A, all of the directions of magnetization in the first ferromagnetic layer 6, the magnetic domain wall displacement layer 8b on the second electrode 2 side and the third ferromagnetic layer 122 as thick magnetic layers are the same. Compared with this, in the case of the magnetized state shown in FIG. 4B, in the first ferromagnetic layer 6, the magnetic domain wall displacement layer 8a on the first electrode 5 side and the third ferromagnetic layer 122 as thick magnetic layers, the directions of magnetization in the magnetic layers adjacent to each other are opposite to each other. Consequently, the electric resistance in the state shown in FIG. 4B becomes larger than the electric resistance in the state shown in FIG. 4A.

Figure 5:
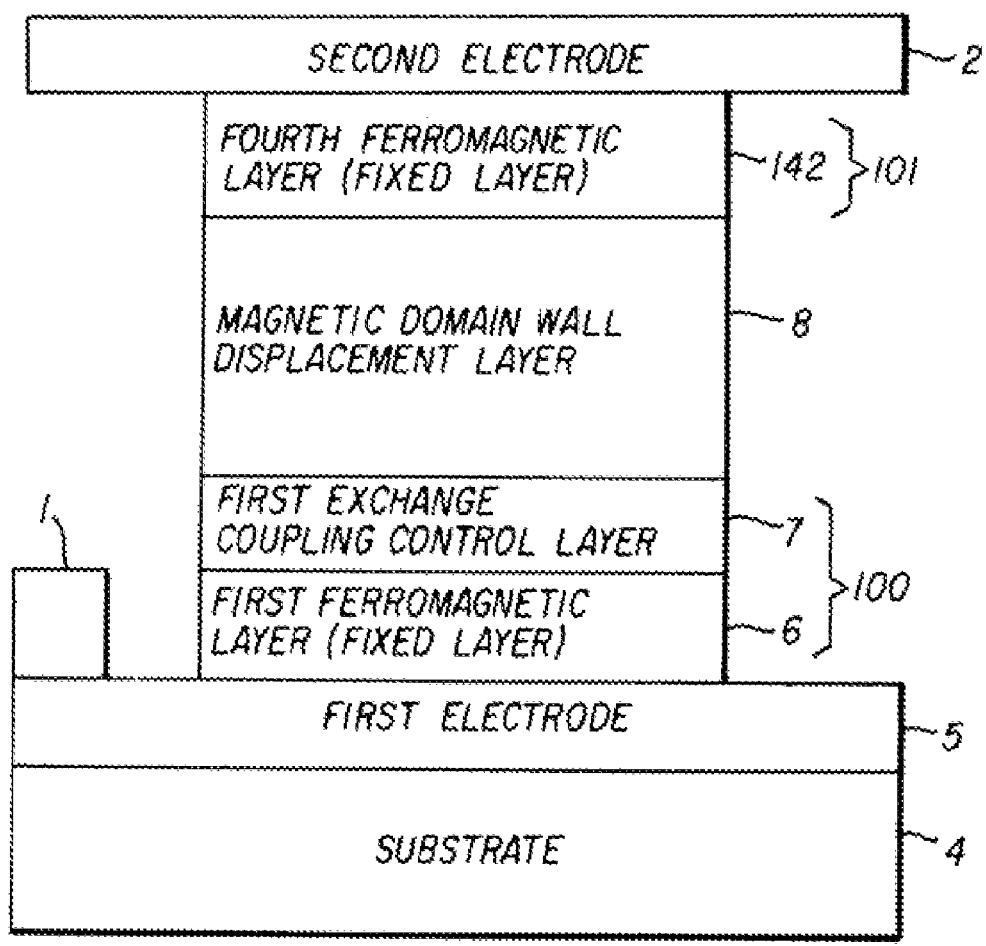
FIG. 5 is a schematic cross sectional view for explaining an example of yet another arrangement of the first embodiment of the spin injection magnetic domain wall displacement element according to the invention.

FIG. 5 is a schematic cross sectional view for explaining an example of yet another arrangement of the first embodiment of the spin injection magnetic domain wall displacement element according to the invention. On a substrate 4, there are formed in the order a first electrode 5, a first magnetic layer group 100, a magnetic domain wall displacement layer 8, a second magnetic layer group 101, and a second electrode 2. Further, a bit line 1 is formed on the first electrode 5. The first magnetic layer group 100 is formed of a first ferromagnetic layer 6 and a first exchange coupling control layer 7. The second magnetic layer group 101 is formed of a fourth ferromagnetic layer 142.

Figure 6A:
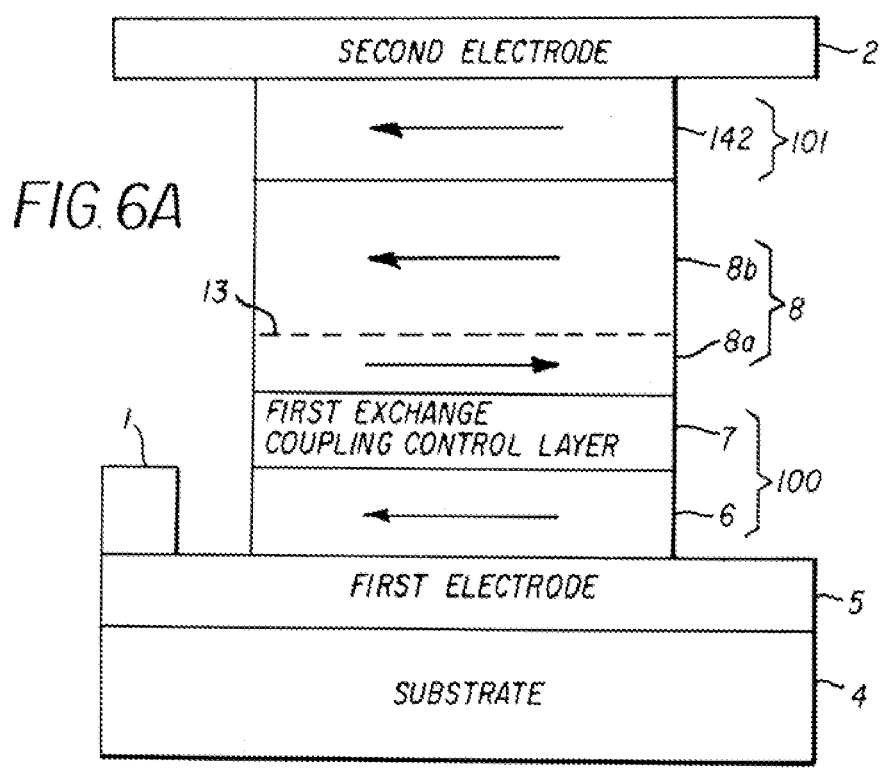
FIG. 6A illustrates FIG. 5 in an initialized state for explaining the operation principle thereof.
Figure 6B:
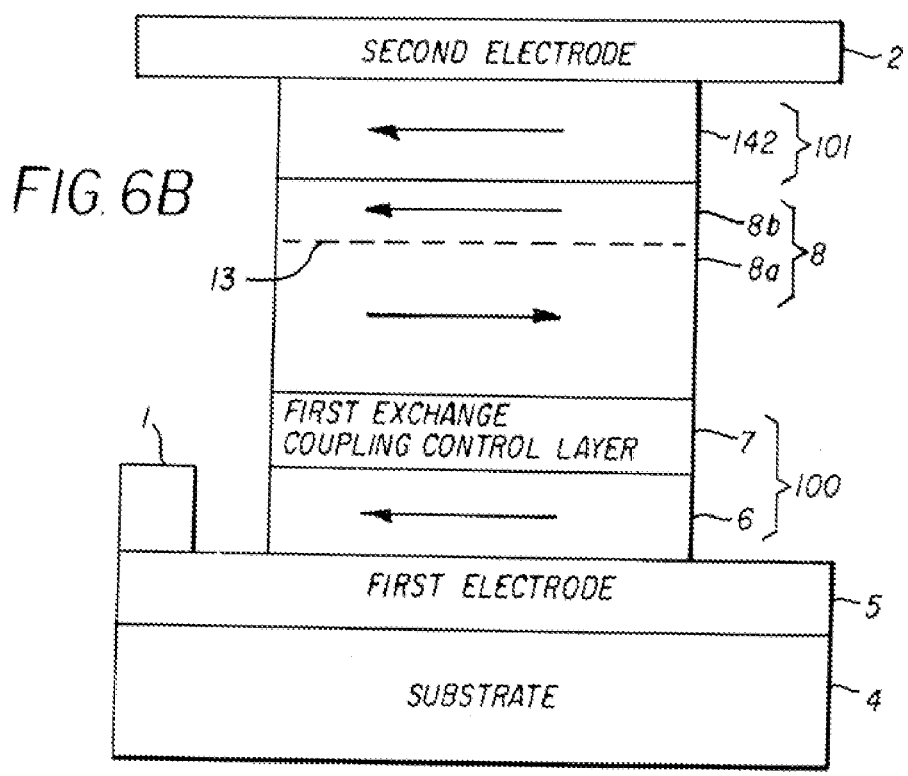
FIG. 6B illustrates FIG. 6A in a state when a current is made to flow from a second electrode to a first electrode in the element in the state shown in FIG. 6A for explaining the operation principle of the element of FIG. 5.

FIGS. 6A and 6B are for explaining the operation principle of the example of the arrangement of the element shown in FIG. 5. In each of the magnetic layers in the element shown in FIG. 5, the direction of magnetization thereof is shown with an arrow. The magnetic domain wall displacement layer 8 is divided by a magnetic domain wall 13 into a magnetic domain wall displacement layer 8a on the first electrode 5 side and a magnetic domain wall displacement layer 8b on the second electrode 2 side.

The substrate 4, the first electrode 5, the first ferromagnetic layer 6, the first exchange coupling control layer 7, the second electrode 2 and the bit line 1 are arranged similarly to those in the element shown in FIG. 1 explained in the foregoing.

The magnetic domain wall displacement layer 8 differs from that in the element shown in FIG. 1 in a method of controlling the magnetic domain wall displacement layer 8b on the second electrode 2 side. However, the material, the film thickness and the magnetic characteristic thereof are provided similarly to those of the element shown in FIG. 1.

The fourth ferromagnetic layer 142 and the magnetic domain wall displacement layer 8 are in direct contact with each other to provide ferromagnetic coupling between the fourth ferromagnetic layer 142 and the magnetic domain wall displacement layer 8b on the second electrode 2 side, by which the direction of magnetization of the magnetic domain wall displacement layer 8b on the second electrode 2 side is fixed in the same direction as the direction of the magnetization of the fourth ferromagnetic layer 142.

The material of the fourth ferromagnetic layer 142 can be selected as necessary from materials having ferromagnetism. For example, alloys such as a Co alloy, a CoPt alloy, a CoPtCr alloy, and a CoCr alloy can be used. During the operation of the element, the magnetization of the fourth ferromagnetic layer 142 is preferably fixed in one direction. Thus, the fourth ferromagnetic layer 142 has preferably a high coercive force and a large film thickness. The coercive force is preferably from 2000 to 4000 Oe and the thickness is preferably from 50 nm to 200 nm.

The area of each of the layers from the first ferromagnetic layer 6 to the fourth ferromagnetic layer 142 is preferably made a little smaller than the area of each of the electrodes to be preferably within the range from 50 nm×50 nm to 300 nm×300 nm.

Each of the layers from the first electrode 5 to the second electrode 2 and the bit line 1 can be formed by a known deposition method for which methods such as sputtering, CVD, and evaporation can be used.

The operation principle is the same as that of the element shown in FIG. 1. Writing is carried out on the basis that the magnetic domain wall 13 is made displaced to positions such as those shown in FIGS. 6A and 6B depending on the direction of the current supplied between the first electrode 5 and the second electrode 2. When a sufficient amount of the current is made to flow from the first electrode 5 to the second electrode 2, a magnetized state becomes as that shown in FIG. 6A, in which the thickness of the magnetic domain wall displacement layer 8a on the first electrode 5 side can be made sufficiently smaller than the electron-spin relaxation length to be on the order of, for example, 20 nm. Conversely, when the current is made to flow from the second electrode 2 to the first electrode 5, the magnetized state becomes as that shown in FIG. 6B, in which the thickness of the magnetic domain wall displacement layer 8b on the second electrode 2 side can be made sufficiently smaller than the electron-spin relaxation length to be on the order of, for example, 20 nm.

Reading is carried out on the basis that the electric resistance of the element is largely changed depending on whether the states of magnetization of the thick magnetic layers are in antiparallel or in parallel and an influence of the magnetization of the thin magnetic layer between the thick magnetic layers on the electric resistance is small. In the case of the magnetized state shown in FIG. 6A, all of the directions of magnetization in the first ferromagnetic layer 6, the magnetic domain wall displacement layer 8b on the second electrode 2 side and the fourth ferromagnetic layer 142 as thick magnetic layers are the same. Compared with this, in the case of the magnetized state shown in FIG. 6B, in the first ferromagnetic layer 6, the magnetic domain wall displacement layer 8a on the first electrode 5 side and the fourth ferromagnetic layer 142 as thick magnetic layers, the directions of magnetization in the magnetic layers adjacent to each other are opposite to each other. Consequently, the electric resistance in the state shown in FIG. 6B becomes larger than the electric resistance in the state shown in FIG. 4A.

The arrangements of the first embodiment can be used in which the order of the layers from the first electrode 5 to the second electrode 2 is just reversed in each of the foregoing arrangements.

Figure 7:
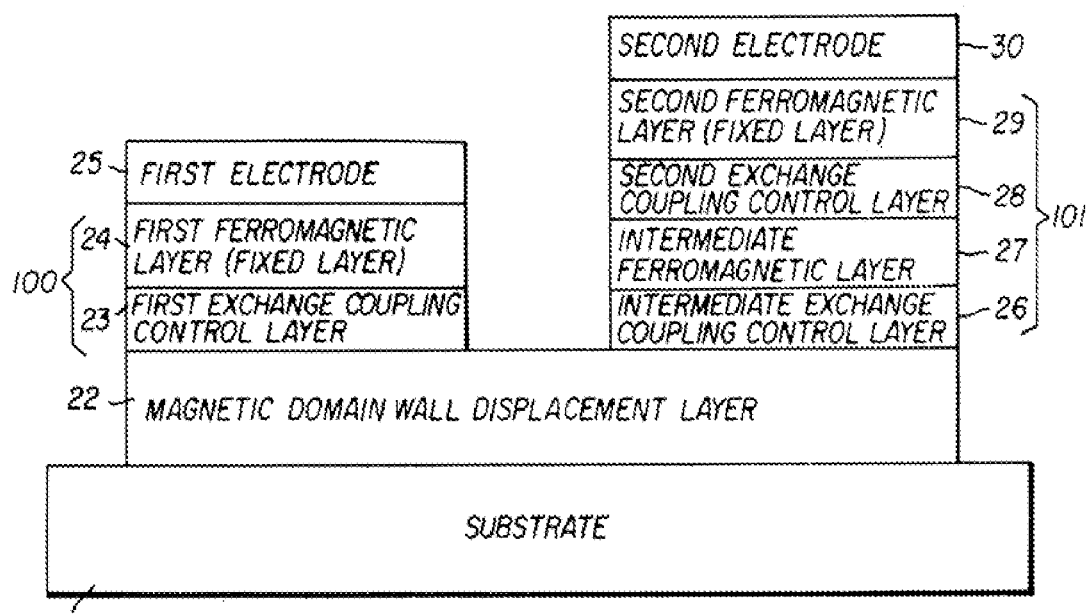
FIG. 7 is a schematic cross sectional view for explaining an example of the basic arrangement of a second embodiment of the spin injection magnetic domain wall displacement element according to the invention.

FIG. 7 is a schematic cross sectional view for explaining an example of the basic arrangement of a second embodiment of the spin injection magnetic domain wall displacement element according to the invention. On a substrate 20, a magnetic domain wall displacement layer 22 is formed, on the one end of which a first magnetic layer group 100 and a first electrode 25 are formed in the order. On the other end of the magnetic domain wall displacement layer 22, a second magnetic layer group 101, and a second electrode 30 are formed in the order. In the first magnetic layer group 100, a first exchange coupling control layer 23 and a first ferromagnetic layer 24 are formed in the order. In the second magnetic layer group 101, an intermediate exchange coupling control layer 26, an intermediate ferromagnetic layer 27, a second exchange coupling control layer 28 and a second ferromagnetic layer 29 are formed in the order.

Figure 8A:
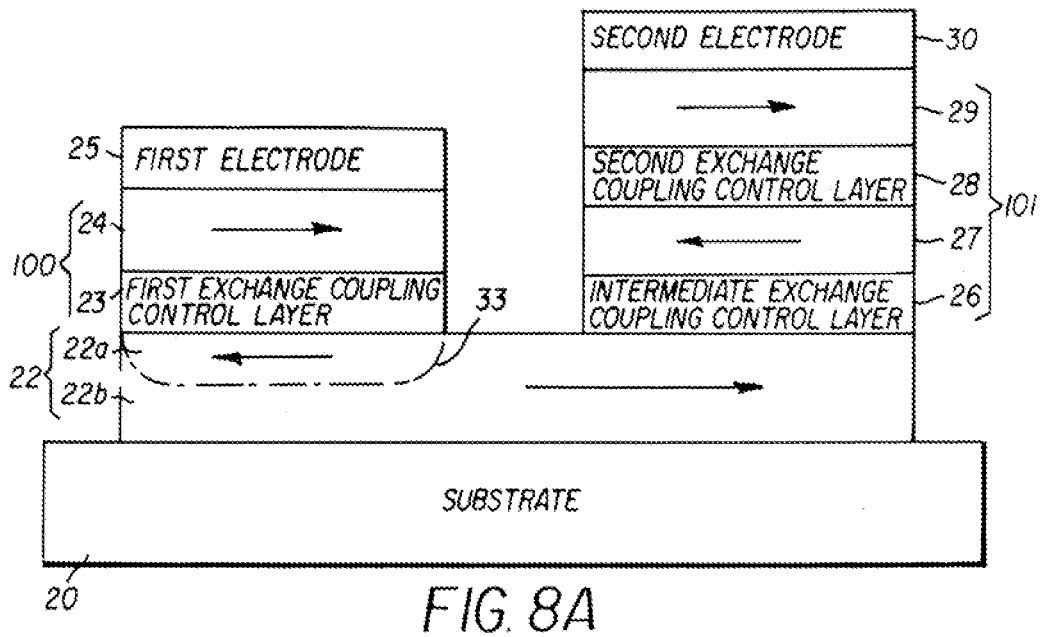
FIG. 8A illustrates FIG. 7 in an initialized state for explaining the operation principle thereof.
Figure 8B:
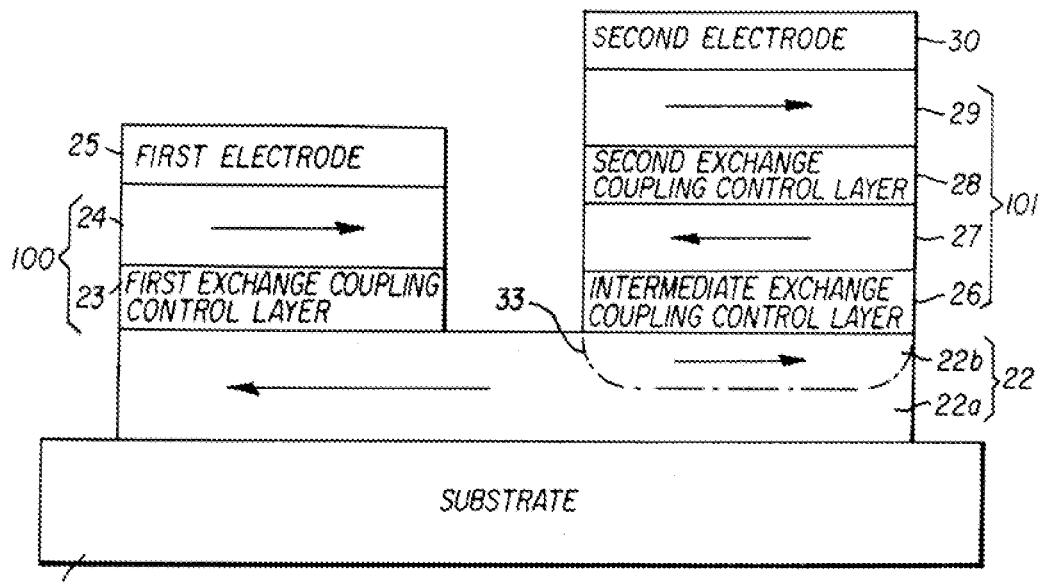
FIG. 8B illustrates FIG. 8A in a state when a current is made to flow from a second electrode to a first electrode in the element in the state shown in FIG. 8A for explaining the operation principle of the example of the arrangement of the element of FIG. 7.

FIGS. 8A and 8B are for explaining the operation principle of the example of the arrangement of the element of FIG. 7. In each of the magnetic layers in the element shown in FIG. 7, the direction of magnetization thereof is shown with an arrow. The magnetic domain wall displacement layer 22 is divided by a magnetic domain wall 33 into a magnetic domain wall displacement layer 22a on the first electrode 25 side and a magnetic domain wall displacement layer 22b on the second electrode 30 side. The arrangement shown in FIG. 7 is the minimum unit of the element and the necessary number of the elements are disposed on the same substrate to form a desired device. Circuits and driving elements for driving the elements according to the invention can be also arranged on the same substrate.

The material for the substrate 20 can be selected as required depending on the desired flatness when the material has an insulation property for individually controlling a plurality of the elements arranged on the substrate and has sufficient rigidity for holding the elements. For example, there can be used an insulating substrate of such a material as sapphire or silicon oxide with a thickness of several hundreds of micrometers or a semiconductor substrate whose surface is oxidized to ensure insulating property.

The material of the first electrode 25 can be selected as required when it is a conductive material. The thickness thereof is preferably within the range from several tens of nanometers to several hundreds of nanometers and its area is preferably within the range from 50 nm×50 nm to 1000 nm×1000 nm. Moreover, the shape thereof is preferably a rectangle, but can be a circle or an oval as desired.

The first ferromagnetic layer 24 and the first exchange coupling control layer 23 are for providing antiferromagnetic coupling between the first ferromagnetic layer 24 and the magnetic domain wall displacement layer 22a on the first electrode 25 side in a part of the magnetic domain wall displacement layer 22. By the antiferromagnetic coupling thus provided, the direction of magnetization of the magnetic domain wall displacement layer 22a on the first electrode 25 side is fixed in the direction opposite to the direction of the magnetization of the first ferromagnetic layer 24.

The material of the first ferromagnetic layer 24 can be selected as necessary from materials having ferromagnetism. For example, alloys such as a Co alloy, a CoPt alloy, a CoPtCr alloy, and a CoCr alloy can be used. During the operation of the element, the magnetization of the first ferromagnetic layer 24 is preferably fixed in one direction. Thus, the first ferromagnetic layer 24 has preferably a high coercive force and a large film thickness. The coercive force is preferably from 2000 to 4000 Oe and the thickness is preferably from 50 nm to 200 nm.

The first exchange coupling control layer 23 is a nonmagnetic layer for separating the first ferromagnetic layer 24 and the magnetic domain wall displacement layer 22 with a specified clearance to control an exchange coupling constant in the exchange coupling between the first ferromagnetic layer 24 and the magnetic domain wall displacement layer 22a on the first electrode 25 side. The material thereof is preferably Ru, V, C, Nb, Mo, Rh, Ta, W, Re, Ir, Pt, or Pd, or an alloy with the main ingredient being any one of the elements. The exchange coupling constant changes from positive value to negative value depending on the thickness of the first exchange coupling control layer 23. Consequently, the thickness of the first exchange coupling control layer 23 is selected so that antiferromagnetic coupling is provided between the first ferromagnetic layer 24 and the magnetic domain wall displacement layer 22a on the first electrode 25 side. However, an excessive thickness of the first exchange coupling control layer 23 causes weak exchange coupling. Therefore, the thickness is preferably determined as being from 0.5 to 3 nm.

The magnetic domain wall displacement layer 22 is a layer that makes the electric resistance of the whole element shown in FIG. 7 change depending on the position of the magnetic domain wall 33 formed in the layer and brings about hysteresis. The detailed explanation of the operation thereof will be given later. The material can be any magnetic material with a magnetic domain wall presented therein, for which a material such as magnetic metal, ferromagnetic semiconductor or ferromagnetic oxide can be used. This is preferably a material such as permalloy, a CoFe alloy, a CoFeB alloy, a NiCoFe alloy, a CoCrFeAl alloy, Fe, a FePt alloy, a NiMnSb alloy, a CoMn group alloy, $Sr_2FeMoO_6$, $Fe_2O_3$, or CoHfTa. Particularly preferable is permalloy, $Co_{90}Fe_{10}$, $Co_2MnAl$, $Co_2MnSi$, or $Co_2MnGe$. The film thickness thereof is preferably from 50 nm to 500 nm. It is necessary that the direction of magnetization of the magnetic domain wall displacement layer 22a on the first electrode 25 side can be easily controlled depending on the direction of magnetization of the first ferromagnetic layer 24, or that the direction of magnetization of the magnetic domain wall displacement layer 22b on the second electrode 30 side can be easily controlled depending on the direction of magnetization of the second ferromagnetic layer 29. Therefore, the coercive force of the magnetic domain wall displacement layer 22 is preferably equal to 10 Oe or less. The size thereof only needs to be a size with which the first magnetic layer group 100 and the second magnetic layer group 101 are formed while being separated with a desired distance and, for integrating a plurality of elements with a high density, a rectangular shape with a width from 30 to 200 nm and a length from 50 to 1000 nm is preferable.

The intermediate exchange coupling control layer 26, the intermediate ferromagnetic layer 27, the second exchange coupling control layer 28 and the second ferromagnetic layer 29 are for providing antiferromagnetic coupling between the second ferromagnetic layer 29 and the intermediate ferromagnetic layer 27, and between the intermediate ferromagnetic layer 27 and the magnetic domain wall displacement layer 22b on the second electrode 30 side. By the antiferromagnetic coupling thus provided, the direction of magnetization of the magnetic domain wall displacement layer 22b on the second electrode 30 side is fixed in the same direction as the direction of the magnetization of the second ferromagnetic layer 29. Furthermore, by adequately controlling the film thickness of the intermediate ferromagnetic layer 27, spins of injected electrons can be controlled.

The intermediate exchange coupling control layer 26 is a nonmagnetic layer for separating the intermediate ferromagnetic layer 27 and the magnetic domain wall displacement layer 22 with a specified clearance to control an exchange coupling constant in the exchange coupling between the intermediate ferromagnetic layer 27 and the magnetic domain wall displacement layer 22b on the second electrode 30 side. The material and the film thickness of the intermediate exchange coupling control layer 26 is determined similarly to those for the first exchange coupling control layer 23.

The intermediate ferromagnetic layer 27 is for providing the above antiferromagnetic coupling and, along with this, for injecting electrons into the adjacent layer with the spins of injected electrons being conserved. For example, electrons injected from the intermediate exchange coupling control layer 26 pass through the intermediate ferromagnetic layer 27 and are injected into the second exchange coupling control layer 28 with respective polarized states of electron spins almost being conserved. The film thickness of the intermediate ferromagnetic layer 27 must be made smaller compared with the relaxation length of electron spin. Thus, the film thickness of the intermediate ferromagnetic layer 27 is preferably 50 nm or less. For well conserving the polarized state of electron spin, the film thickness between 5 nm and 20 nm is particularly preferable. Moreover, the direction of magnetization of the intermediate ferromagnetic layer 27 must be easily controlled by the magnetization of the second ferromagnetic layer 29. Thus, the material of the intermediate ferromagnetic layer 27 is preferably provided as a material having a smaller coercive force compared with the material of the second ferromagnetic layer 29. Thus, materials such as a CoHfTa alloy, a CoZrNb alloy, a CoFe alloy, a FeCoN alloy, a FeAlN alloy, a $Ni_{45}Fe_{55}$ alloy, a $Ni_{81}Fe_{19}$ alloy, a NiFeMo alloy, and a FeTaN alloy are preferable. Furthermore, the coercive force is preferably provided as 20 Oe or less.

The second exchange coupling control layer 28 is a nonmagnetic layer for separating the intermediate ferromagnetic layer 27 and the second ferromagnetic layer 29 with a specified clearance to control an exchange coupling constant in the exchange coupling between the intermediate ferromagnetic layer 27 and the second ferromagnetic layer 29. The material and the film thickness of the second exchange coupling control layer 28 is determined similarly to those for the first exchange coupling control layer 23.

The second ferromagnetic layer 29 can be selected as necessary from materials having ferromagnetism. For example, alloys such as a Co alloy, a CoPt alloy, a CoPtCr alloy, and a CoCr alloy can be used. During the operation of the element, the magnetization of the second ferromagnetic layer 29 is preferably fixed in one direction. Thus, the second ferromagnetic layer 29 has preferably a high coercive force and a large film thickness. The coercive force is preferably from 2000 to 4000 Oe and the thickness is preferably from 50 nm to 200 nm.

The material of the second electrode 30 can be selected as required when it is a conductive material. The thickness thereof is preferably within the range from several tens of nanometers to several hundreds of nanometers and its area is preferably within the range from 50 nm×50 nm to 300 nm×300 nm. Moreover, the shape thereof is preferably a rectangle, but can be a circle or an oval as desired.

The area of each of the first ferromagnetic layer 24 and the first exchange coupling control layer 23 is preferably made equivalent to the area of the first electrode 25. Moreover, the area of each of the layers from the intermediate exchange coupling control layer 26 to the second ferromagnetic layer 29 is preferably made equivalent to the area of the second electrode 30.

Each of the layers on the substrate 20 can be formed by a known deposition method for which methods such as sputtering, CVD, and evaporation can be used.

Figure 9:
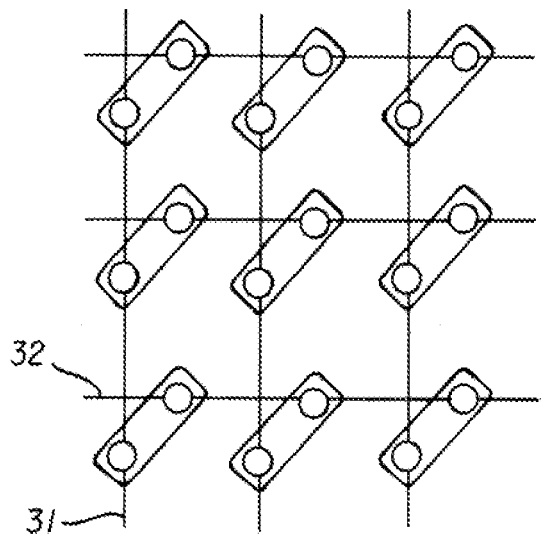
FIG. 9 is a schematic view for explaining a method of arranging a plurality of the spin injection magnetic domain wall displacement elements of the second and third embodiments according to the invention while being connected with one another.

FIG. 9 is a schematic view for explaining a method of arranging a plurality of the elements shown in FIG. 7 while being connected with one another. In FIG. 9, the first electrodes 25 are connected to a plurality of horizontally running word lines 32 and the second electrodes 30 are connected to a plurality of vertically running bit lines 31, which enables realization of an integrated magnetic memory.

The operation principle of the element according to the second embodiment follows using FIGS. 8A and 8B. First, the operation principle in the case of carrying out writing or recording in the element will be explained. Referring to FIG. 8A, the element is initialized first. Here, the element is in a magnetized state when a strong rightward magnetic field equivalent to a saturation magnetic field is applied to the element to provide rightward magnetization of all of the first ferromagnetic layer 24 and the second ferromagnetic layer 29 before the magnetic field is removed.

Antiferromagnetic coupling is provided between the first ferromagnetic layer 24 and the magnetic domain wall displacement layer 22a on the first electrode 25 side, and the coercive force of the first ferromagnetic layer 24 is higher than the coercive force of the magnetic domain wall displacement layer 22. This causes leftward magnetization, becoming opposite to the direction of magnetization of the first ferromagnetic layer 24, to be induced in the magnetic domain wall displacement layer 22a on the first electrode 25 side. Moreover, antiferromagnetic coupling is provided between the second ferromagnetic layer 29 and the intermediate ferromagnetic layer 27, and the coercive force of the second ferromagnetic layer 29 is higher than the coercive force of the intermediate ferromagnetic layer 27. This causes leftward magnetization, opposite to the direction of magnetization of the second ferromagnetic layer 29, to be induced in the intermediate ferromagnetic layer 27. Furthermore, antiferromagnetic coupling is provided between the intermediate ferromagnetic layer 27 and the magnetic domain wall displacement layer 22b on the second electrode 30 side. This causes rightward magnetization, becoming opposite to the direction of magnetization of the intermediate ferromagnetic layer 27, to be induced in the magnetic domain wall displacement layer 22b on the second electrode 30 side. Therefore, the directions of magnetization induced in the magnetic domain wall displacement layers 22a and 22b are to be invariably opposite to each other. Since the coercive force of the magnetic domain wall displacement layer 22 is small, a plurality of magnetic domain walls are produced in some cases. However, by letting a current flow from the first electrode 25 to the second electrode 30 on the basis of the principle explained with reference to FIGS. 21, 22A, and 22B, the magnetic domain walls can be concentrated to the position of the magnetic wall 33 shown in FIG. 8A. Moreover, in the magnetic domain wall displacement layer 22a on the first electrode 25 side, by antiferromagnetic coupling with the first ferromagnetic layer 24, magnetization in the direction opposite to the direction of magnetization of the first ferromagnetic layer 24 is invariably induced. Thus, even in the case of letting a current continuously flow from the first electrode 25 to the second electrode 30, one stable magnetic domain wall can be formed in the magnetic domain wall displacement layer 22.

In the element in the state as shown in FIG. 8A, a current made to continuously flow from the second electrode 30 toward the first electrode 25 causes the magnetic domain wall 33 to displace in the direction opposite to the direction of the current, by which the magnetic domain wall disposition as shown in FIG. 8B is presented. When the current is made stopped, the antiferromagnetic coupling between the intermediate ferromagnetic layer 27 and the magnetic domain wall displacement layer 22b on the second electrode 30 side causes magnetization in the direction opposite to the direction of magnetization of the intermediate ferromagnetic layer 27 to be invariably induced in the magnetic domain wall displacement layer 22b on the second electrode 30 side. Therefore, one stable magnetic domain wall is formed in the magnetic domain wall displacement layer 22 without disappearance. Moreover, by letting a sufficient amount of current flow, the thickness of the magnetic domain wall displacement layer 22b on the second electrode 30 side can be made sufficiently smaller compared with electron spin relaxation length. For example, the thickness can be made on the order of 20 nm.

In the element in the state as shown in FIG. 8B, a current made to continuously flow from the first electrode 25 toward the second electrode 30 causes an operation carried out in reverse to the foregoing, by which the element is brought to the state as shown in FIG. 8A. Moreover, by letting a sufficient amount of current flow, the thickness of the magnetic domain wall displacement layer 22a on the first electrode 25 side can be made sufficiently smaller compared with electron spin relaxation length. For example, the thickness can be made on the order of 20 nm. In this way, by reversing the direction of current, the magnetic domain wall 33 can be freely made positioned at either end section of the magnetic domain wall displacement layer 22.

The operation principle in the case of reading out a record or detecting a state of magnetization in the element follows. The operation principle is the same as that explained about the first embodiment, which is based on the fact that the behavior of electron spin differs depending on the relative relation between a thickness of a magnetic layer and an electron spin relaxation length. In the following, a method of detecting difference in electric resistance of an element will be explained with the case of letting a detecting current flow from the second electrode 30 to the first electrode 25 (namely, the case of injecting electrons from the first electrode 25 toward the second electrode 30) for the element shown in FIG. 7 taken as an example. Moreover, the meaning that each layer is "thick" or "thin" is as follows. The case where a distance in which an electron passes through in the layer is equivalent to or more compared with the electron spin relaxation length is expressed as being "thick", and the case where the distance is sufficiently shorter compared with the electron spin relaxation length is expressed as being "thin".

As was explained above, the electric resistance of the element is largely changed depending on whether the states of magnetization of the thick magnetic layers are in antiparallel or in parallel and an influence of the magnetization of the thin magnetic layer between the thick magnetic layers on the electric resistance is small. In the case of the magnetized state shown in FIG. 8A, all of the directions of magnetization in the first ferromagnetic layer 24, the magnetic domain wall displacement layer 22b on the second electrode 30 side and the second ferromagnetic layer 29 as thick magnetic layers are the same. Compared with this, in the case of the magnetized state shown in FIG. 8B, in the first ferromagnetic layer 24, the magnetic domain wall displacement layer 22a on the first electrode 25 side and the second ferromagnetic layer 29 as thick magnetic layers, the directions of magnetization in the magnetic layers adjacent to each other are opposite to each other. Consequently, the electric resistance in the state shown in FIG. 8B becomes larger than the electric resistance in the state shown in FIG. 8A. Therefore, by measuring electric resistance across both of the electrodes, the state of internal magnetization of the element can be easily detected.

Moreover, detection of a flowed current by continuous detection of the state of magnetization of the element and multi-value recording by stepwise classification of the change in electric resistance can be also brought into realization according to the method explained about the first embodiment.

The arrangement shown in FIG. 7 can be modified as necessary within the range without departing from the gist of the invention. For example, antiferromagnetic coupling can be changed to ferromagnetic coupling. In the following, more specific explanations will be presented.

Figure 10:
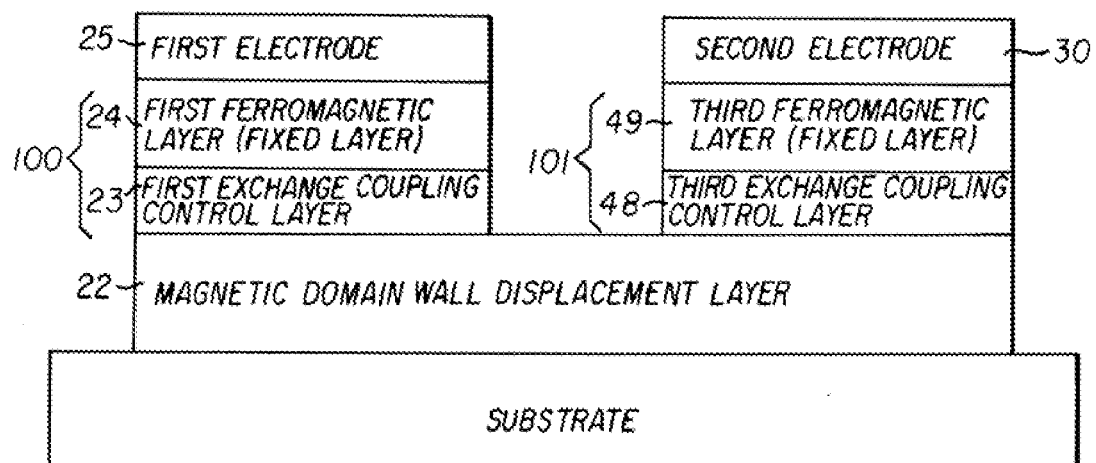
FIG. 10 is a schematic cross sectional view for explaining an example of another arrangement of the second embodiment of the spin injection magnetic domain wall displacement element according to the invention.

FIG. 10 is a schematic cross sectional view for explaining an example of another arrangement of the second embodiment of the spin injection magnetic domain wall displacement element according to the invention. On a substrate 20, a magnetic domain wall displacement layer 22 is formed, on the one end of which a first magnetic layer group 100 and a first electrode 25 are formed in the order. On the other end of the magnetic domain wall displacement layer 22, a second magnetic layer group 101, and a second electrode 30 are formed in the order. In the first magnetic layer group 100, a first exchange coupling control layer 23 and a first ferromagnetic layer 24 are formed in the order. In the second magnetic layer group 101, a third exchange coupling control layer 48, and a third ferromagnetic layer 49 are formed in the order.

Figure 11A:
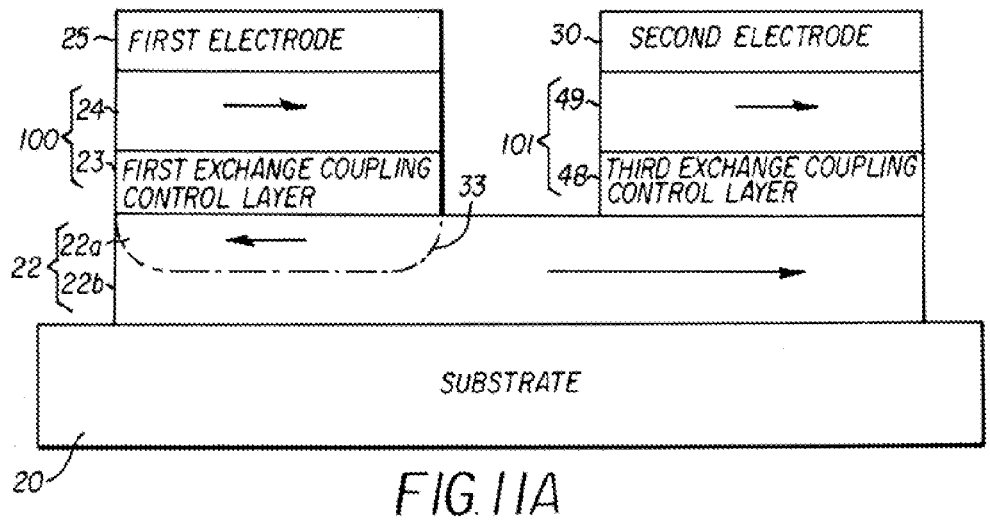
FIG. 11A illustrates FIG. 10 in an initialized state for explaining the operation principle thereof.
Figure 11B:
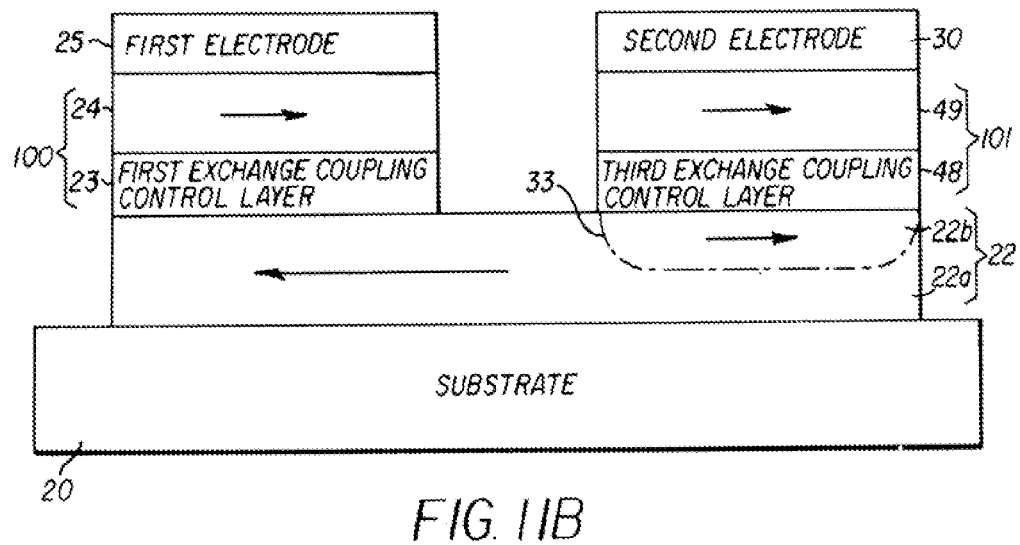
FIG. 11B illustrates FIG. 11A in a state when a current is made to flow from a second electrode to a first electrode in the element in the state shown in FIG. 11A for explaining the operation principle of the element of FIG. 10.

FIGS. 11A and 11B are for explaining the operation principle of the example of the arrangement of the element of FIG. 10. In each of the magnetic layers in the element shown in FIG. 10, the direction of magnetization thereof is shown with an arrow. The magnetic domain wall displacement layer 22 is divided by a magnetic domain wall 33 into a magnetic domain wall displacement layer 22a on the first electrode 25 side and a magnetic domain wall displacement layer 22b on the second electrode 30 side.

The substrate 20, the first electrode 25, the first ferromagnetic layer 24, the first exchange coupling control layer 23 and the second electrode 30 are arranged similarly to those in the element shown in FIG. 7 explained in the foregoing.

The magnetic domain wall displacement layer 22 differs from that in the element shown in FIG. 7 in a method of controlling the magnetic domain wall displacement layer 22b on the second electrode 30 side. However, the material, the film thickness, and the magnetic characteristic thereof are provided similarly to those of the element shown in FIG. 7.

The third exchange coupling control layer 48 and the third ferromagnetic layer 49 are for providing ferromagnetic coupling between the third ferromagnetic layer 49 and the magnetic domain wall displacement layer 22b on the second electrode 30 side. By the ferromagnetic coupling thus provided, the direction of magnetization of the magnetic domain wall displacement layer 22b on the second electrode 30 side is fixed in the same direction as the direction of the magnetization of the third ferromagnetic layer 49.

The third exchange coupling control layer 48 is a nonmagnetic layer for separating the magnetic domain wall displacement layer 22 and the third ferromagnetic layer 49 with a specified clearance to control an exchange coupling constant in the exchange coupling between the magnetic domain wall displacement layer 22b on the second electrode 30 side and the third ferromagnetic layer 49. The material of the third exchange coupling control layer 48 is determined similarly to that for the first exchange coupling control layer 23. Moreover, the film thickness thereof is determined so that a ferromagnetic coupling is provided between the magnetic domain wall displacement layer 22b on the second electrode 30 side and the third ferromagnetic layer 49.

The material of the third ferromagnetic layer 49 can be selected as necessary from materials having ferromagnetism. For example, alloys such as a Co alloy, a CoPt alloy, a CoPtCr alloy, and a CoCr alloy can be used. During the operation of the element, the magnetization of the third ferromagnetic layer 49 is preferably fixed in one direction. Thus, the third ferromagnetic layer 49 has preferably a high coercive force and a large film thickness. The coercive force is preferably from 2000 to 4000 Oe and the thickness is preferably from 50 nm to 200 nm.

The area of each of the first ferromagnetic layer 24 and the first exchange coupling control layer 23 is preferably made equivalent to the area of the first electrode 25. Moreover, the area of each of the third ferromagnetic layer 49 and the third exchange coupling control layer 48 is preferably made equivalent to the area of the second electrode 30.

Each of the layers on the substrate 20 can be formed by a known deposition method for which methods such as sputtering, CVD, and evaporation can be used.

The operation principle is the same as that of the element shown in FIG. 7. Writing is carried out on the basis that the magnetic domain wall 33 is made displaced to positions such as those shown in FIGS. 11A and 11B depending on the direction of a current supplied between the first electrode 25 and the second electrode 30. When a sufficient amount of the current is made to flow from the first electrode 25 to the second electrode 30, a magnetized state becomes as that shown in FIG. 11A, in which the thickness of the magnetic domain wall displacement layer 22a on the first electrode 25 side can be made sufficiently smaller than the electron-spin relaxation length to be on the order of, for example, 20 nm. Conversely, when a sufficient amount of the current is made to flow from the second electrode 30 to the first electrode 25, the magnetized state becomes as that shown in FIG. 11B, in which the thickness of the magnetic domain wall displacement layer 22b on the second electrode 30 side can be made sufficiently smaller than the electron-spin relaxation length to be on the order of, for example, 20 nm.

Reading is carried out on the basis that the electric resistance of the element is largely changed depending on whether the states of magnetization of the thick magnetic layers are in antiparallel or in parallel and an influence of the magnetization of the thin magnetic layer between the thick magnetic layers on the electric resistance is small. In the case of the magnetized state shown in FIG. 11A, all of the directions of magnetization in the first ferromagnetic layer 24, the magnetic domain wall displacement layer 22b on the second electrode 30 side and the third ferromagnetic layer 49 as thick magnetic layers are the same. Compared with this, in the case of the magnetized state shown in FIG. 11B, in the first ferromagnetic layer 24, the magnetic domain wall displacement layer 22a on the first electrode 25 side and the third ferromagnetic layer 49 as thick magnetic layers, the directions of magnetization in the magnetic layers adjacent to each other are opposite to each other. Consequently, the electric resistance in the state shown in FIG. 11B becomes larger than the electric resistance in the state shown in FIG. 11A.

Figure 12:
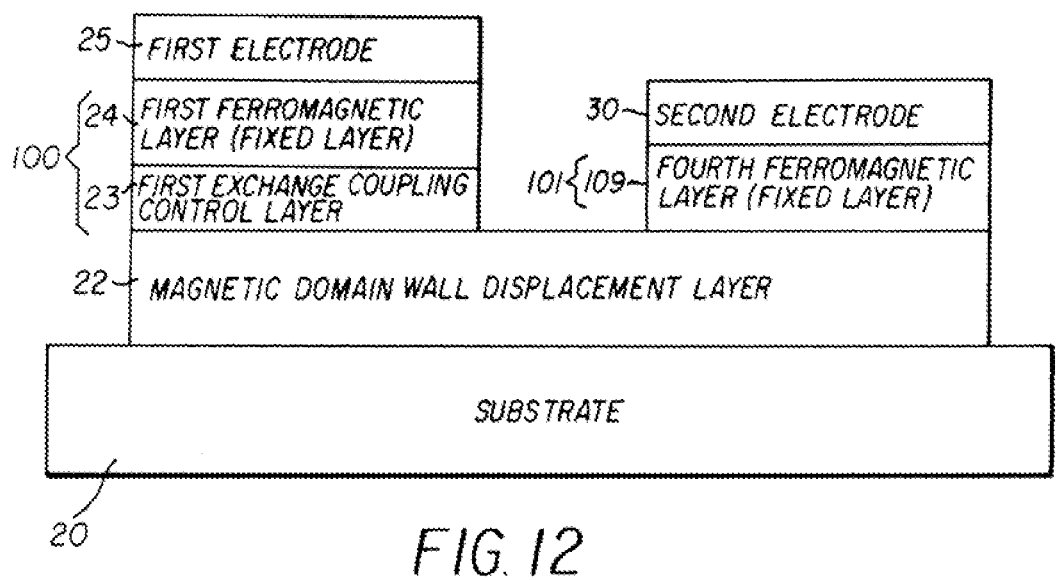
FIG. 12 is a schematic cross sectional view for explaining an example of yet another arrangement of the second embodiment of the spin injection magnetic domain wall displacement element according to the invention.

FIG. 12 is a schematic cross sectional view for explaining an example of further another arrangement of the second embodiment of the spin injection magnetic domain wall displacement element according to the invention. On a substrate 20, a magnetic domain wall displacement layer 22 is formed, on the one end of which a first magnetic layer group 100 and a first electrode 25 are formed in the order. On the other end of the magnetic domain wall displacement layer 22, a second magnetic layer group 101, and a second electrode 30 are formed in the order. In the first magnetic layer group 100, a first exchange coupling control layer 23, and a first ferromagnetic layer 24 are formed in the order. The second magnetic layer group 101 is formed of a fourth ferromagnetic layer 109.

Figure 13A:
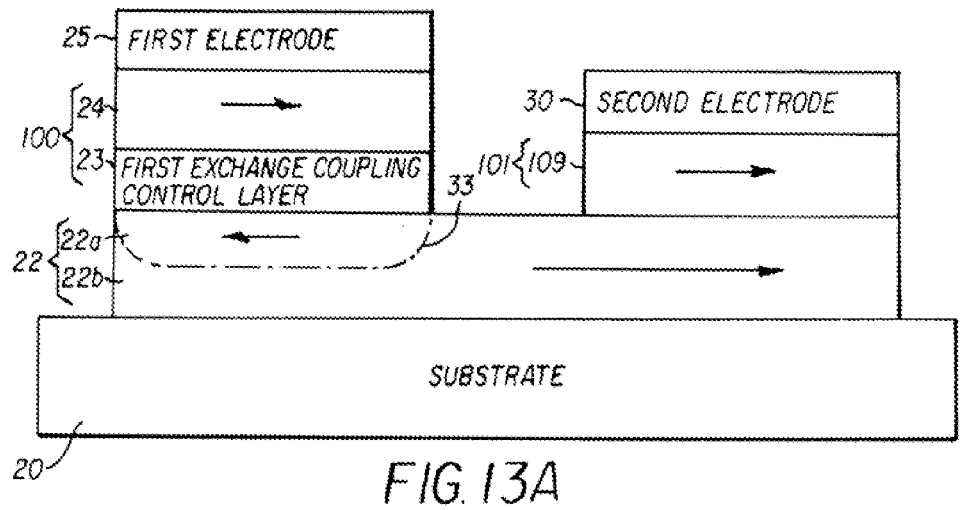
FIG. 13A illustrates FIG. 12 in an initialized state for explaining the operation principle thereof.
Figure 13B:
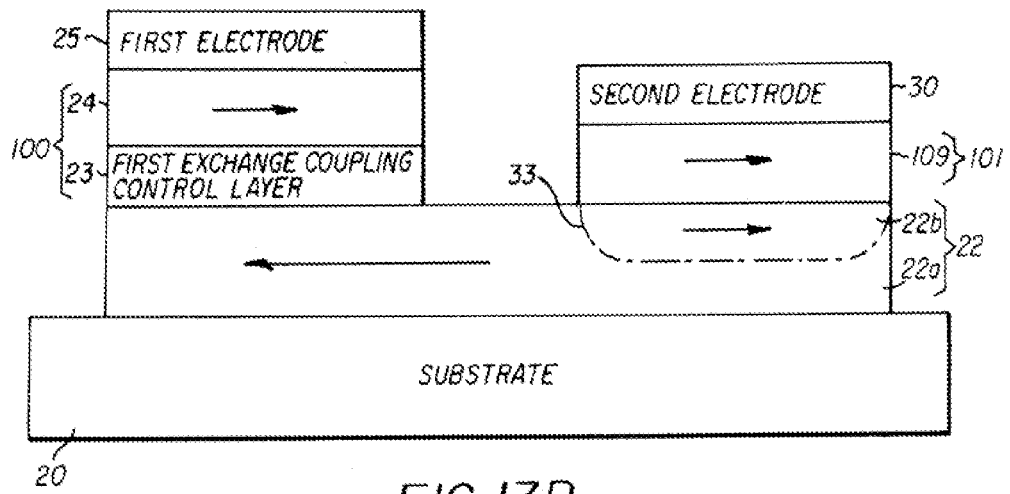
FIG. 13B illustrates FIG. 13A in a state when a current is made to flow from a second electrode to a first electrode in the element in the state shown in FIG. 13A for explaining the operation principle of the element of FIG. 12.

FIGS. 13A and 13B are for explaining the operation principle of the example of the arrangement of the element of FIG. 12. In each of the magnetic layers in the element shown in FIG. 12, the direction of magnetization thereof is shown with an arrow. The magnetic domain wall displacement layer 22 is divided by a magnetic domain wall 33 into a magnetic domain wall displacement layer 22a on the first electrode 25 side and a magnetic domain wall displacement layer 22b on the second electrode 30 side.

The substrate 20, the first electrode 25, the first ferromagnetic layer 24, the first exchange coupling control layer 23, the second electrode 30 are arranged similarly to those in the element of FIG. 7.

The magnetic domain wall displacement layer 22 differs from that in the element shown in FIG. 7 in a method of controlling the magnetic domain wall displacement layer 22b on the second electrode 30 side. However, the material, the film thickness and the magnetic characteristic thereof are provided similarly to those of the element shown in FIG. 7.

The fourth ferromagnetic layer 109 and the magnetic domain wall displacement layer 22 are in direct contact with each other to provide ferromagnetic coupling between the fourth ferromagnetic layer 109 and the magnetic domain wall displacement layer 22b on the second electrode 30 side, by which the direction of magnetization of the magnetic domain wall displacement layer 22b on the second electrode 30 side is fixed in the same direction as the direction of the magnetization of the fourth ferromagnetic layer 109.

The material of the fourth ferromagnetic layer 109 can be selected as necessary from materials having ferromagnetism. For example, alloys such as a Co alloy, a CoPt alloy, a CoPtCr alloy, and a CoCr alloy can be used. During the operation of the element, the magnetization of the fourth ferromagnetic layer 109 is preferably fixed in one direction. Thus, the fourth ferromagnetic layer 109 has preferably a high coercive force and a large film thickness. The coercive force is preferably from 2000 to 4000 Oe and the thickness is preferably from 50 nm to 200 nm.

The area of each of the first ferromagnetic layer 24 and the first exchange coupling control layer 23 is preferably made equivalent to the area of the first electrode 25. Moreover, the area of the fourth ferromagnetic layer 109 is preferably made equivalent to the area of the second electrode 30.

Each of the layers on the substrate 20 can be formed by a known deposition method for which methods such as sputtering, CVD, and evaporation can be used.

The operation principle is the same as that of the element shown in FIG. 7. Writing is carried out on the basis that the magnetic domain wall 33 is made displaced to positions such as those shown in FIGS. 13A and 13B depending on the direction of a current supplied between the first electrode 25 and the second electrode 30. When a sufficient amount of the current is made to flow from the first electrode 25 to the second electrode 30, a magnetized state becomes as that shown in FIG. 13A, in which the thickness of the magnetic domain wall displacement layer 22a on the first electrode 25 side can be made sufficiently smaller than the electron-spin relaxation length to be on the order of, for example, 20 nm. Conversely, when a sufficient amount of the current is made to flow from the second electrode 30 to the first electrode 25, the magnetized state becomes as that shown in FIG. 13B, in which the thickness of the magnetic domain wall displacement layer 22b on the second electrode 30 side can be made sufficiently smaller than the electron-spin relaxation length to be on the order of, for example, 20 nm.

Reading is carried out on the basis that the electric resistance of the element is largely changed depending on whether the states of magnetization of the thick magnetic layers are in antiparallel or in parallel and an influence of the magnetization of the thin magnetic layer between the thick magnetic layers on the electric resistance is small. In the case of the magnetized state shown in FIG. 13A, all of the directions of magnetization in the first ferromagnetic layer 24, the magnetic domain wall displacement layer 22b on the second electrode 30 side and the fourth ferromagnetic layer 109 as thick magnetic layers are the same. Compared with this, in the case of the magnetized state shown in FIG. 13B, in the first ferromagnetic layer 24, the magnetic domain wall displacement layer 22a on the first electrode 25 side and the fourth ferromagnetic layer 109 as thick magnetic layers, the directions of magnetization in the magnetic layers adjacent to each other are opposite to each other. Consequently, the electric resistance in the state shown in FIG. 13B becomes larger than the electric resistance in the state shown in FIG. 13A.

Other arrangements of the second embodiment can be made so that in each of which the order of the layers from the first electrode 25 to the second electrode 30 is just reversed in each of the foregoing arrangements.

Figure 14:
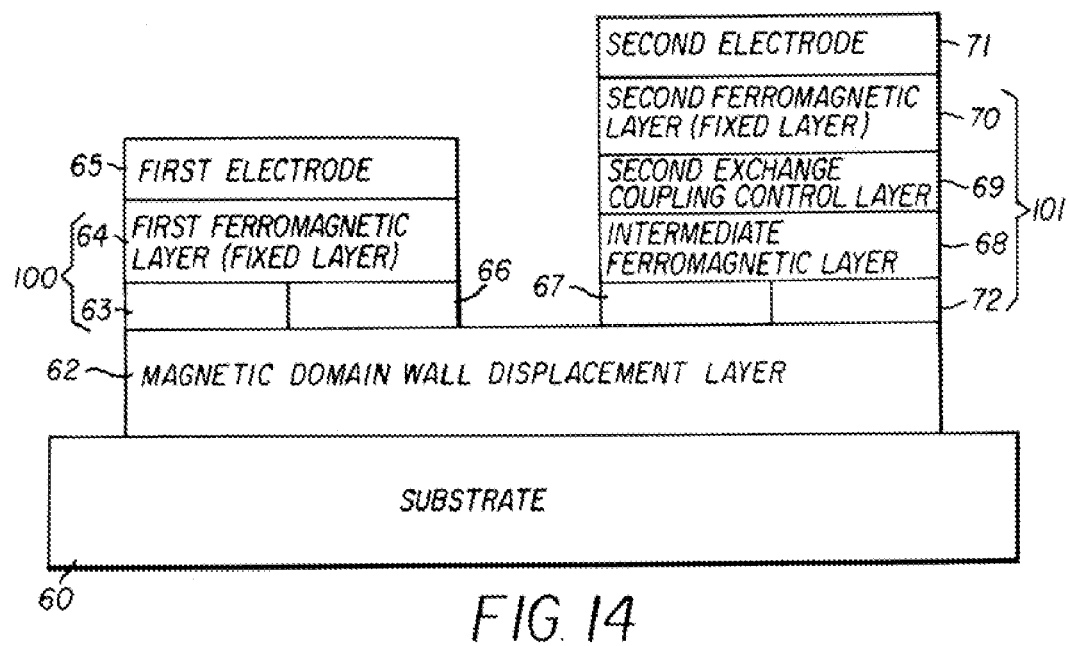
FIG. 14 is a schematic cross sectional view for explaining an example of the basic arrangement of a third embodiment of a spin injection magnetic domain wall displacement element according to the invention.

FIG. 14 is a schematic cross sectional view for explaining an example of the basic arrangement of a third embodiment of the spin injection magnetic domain wall displacement element according to the invention. On a substrate 60, a magnetic domain wall displacement layer 62 is formed, on the one end of which a first magnetic layer group 100 and a first electrode 65 are formed in the order. On the other end of the magnetic domain wall displacement layer 62, a second magnetic layer group 101, and a second electrode 71 are formed in the order. In the first magnetic layer group 100, a first exchange coupling control layer 63 and a first nonmagnetic metal layer 66 are formed adjacent to each other, on both of which a first ferromagnetic layer 64 is formed. In the second magnetic layer group 101, an intermediate nonmagnetic metal layer 67 and an intermediate exchange coupling control layer 72 are formed adjacent to each other, on both of which an intermediate ferromagnetic layer 68, a second exchange coupling control layer 69 and a second ferromagnetic layer 70 are formed in the order.

Figure 15A:
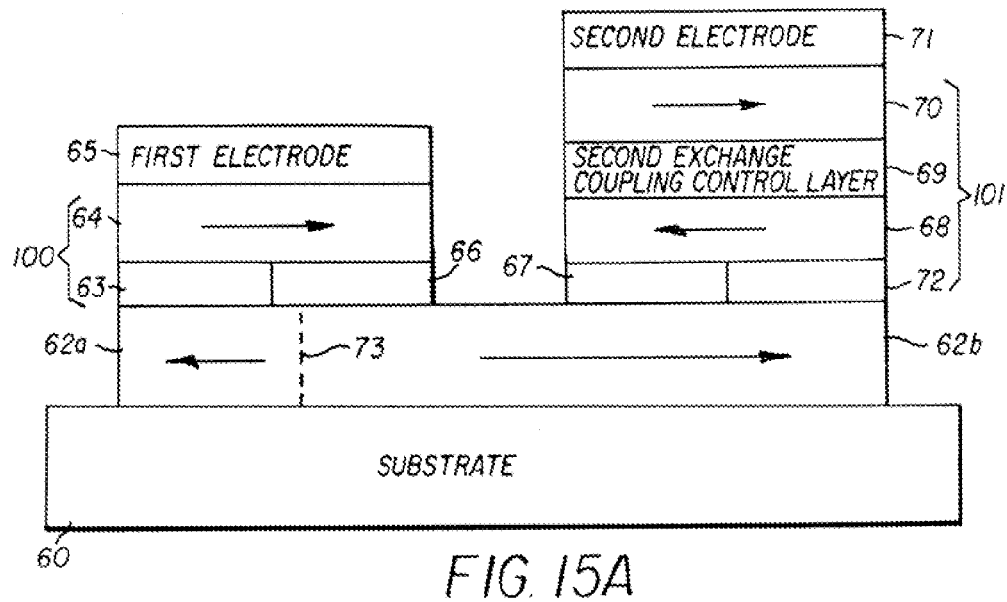
FIG. 15A illustrates FIG. 14 in an initialized state for explaining the operation principle thereof.
Figure 15B:
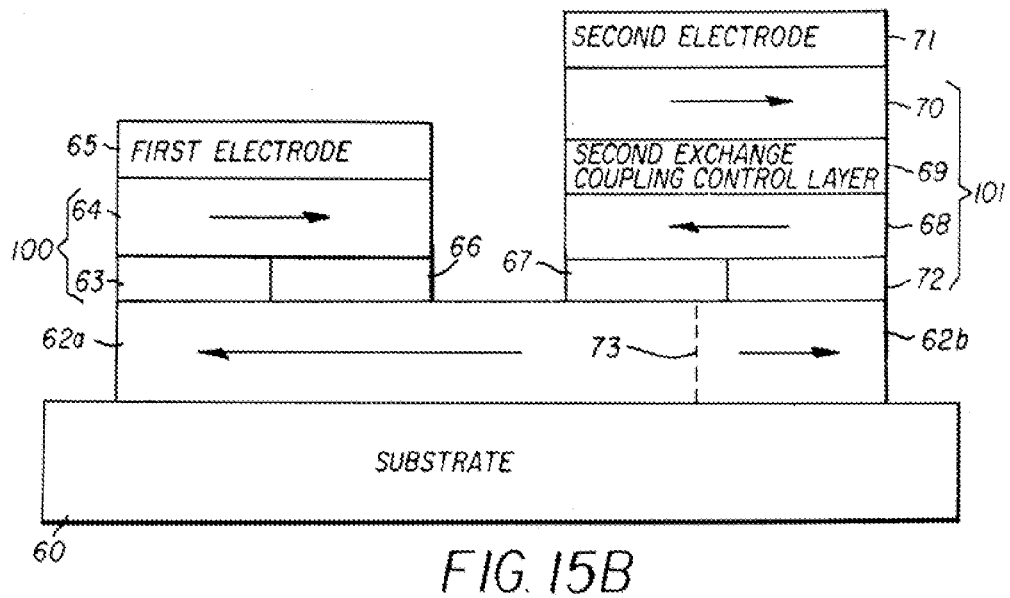
FIG. 15B illustrates FIG. 15A in a state when a current is made to flow from a second electrode to a first electrode in the element in the state shown in FIG. 15A for explaining the operation principle of the element of FIG. 14.

FIGS. 15A and 15B are for explaining the operation principle of the example of the arrangement of the element shown in FIG. 14. In each of the magnetic layers in the element shown in FIG. 14, the direction of magnetization thereof is shown with an arrow. The magnetic domain wall displacement layer 62 is divided by a magnetic domain wall 73 into a magnetic domain wall displacement layer 62a on the first electrode 65 side and a magnetic domain wall displacement layer 62b on the second electrode 71 side. The arrangement shown in FIG. 14 is the minimum unit of the element and the necessary number of the elements are disposed on the same substrate to form a desired device. Circuits and driving elements for driving the elements according to the invention can be also arranged on the same substrate.

A material for the substrate 60 can be selected as required depending on the desired flatness when the material has an insulation property for individually controlling a plurality of the elements arranged on the substrate and has sufficient rigidity for holding the elements. For example, there can be used an insulating substrate of such sapphire or silicon oxide with a thickness of several hundreds of micrometers or a semiconductor substrate whose surface is oxidized to ensure insulating property.

The material of the first electrode 65 can be selected as required when it is a conductive material. The thickness thereof is preferably within the range from several tens of nanometers to several hundreds of nanometers and its area is preferably within the range from 50 nm×50 nm to 300 nm×300 nm. Moreover, the shape thereof is preferably a rectangle, but can be a circle or an oval as desired.

The first ferromagnetic layer 64 and the first exchange coupling control layer 63 are for providing antiferromagnetic coupling between the first ferromagnetic layer 64 and the magnetic domain wall displacement layer 22a on the first electrode 65 side in a part of the magnetic domain wall displacement layer 62. By the antiferromagnetic coupling thus provided, the direction of magnetization of the magnetic domain wall displacement layer 62a on the first electrode 65 side is fixed in the direction opposite to the direction of the magnetization of the first ferromagnetic layer 64.

The material of the first ferromagnetic layer 64 can be selected as necessary from materials having ferromagnetism. For example, alloys such as a Co alloy, a CoPt alloy, a CoPtCr alloy, and a CoCr alloy can be used. During the operation of the element, the magnetization of the first ferromagnetic layer 64 is preferably fixed in one direction. Thus, the first ferromagnetic layer 64 has preferably a high coercive force and a large film thickness. The coercive force is preferably from 2000 to 4000 Oe and the thickness is preferably from 50 nm to 200 nm.

The first exchange coupling control layer 63 is a nonmagnetic layer for separating the first ferromagnetic layer 64 and the magnetic domain wall displacement layer 62 with a specified clearance to control an exchange coupling constant in the exchange coupling between the first ferromagnetic layer 64 and the magnetic domain wall displacement layer 62a on the first electrode 65 side. The material thereof is preferably Ru, V, C, Nb, Mo, Rh, Ta, W, Re, Ir, Pt, or Pd, or an alloy with the main ingredient being any one of the elements. The exchange coupling constant changes from positive value to negative value depending on the thickness of the first exchange coupling control layer 63. Consequently, the thickness of the first exchange coupling control layer 63 is selected so that antiferromagnetic coupling is provided between the first ferromagnetic layer 64 and the magnetic domain wall displacement layer 62a on the first electrode 65 side. However, an excessive thickness of the first exchange coupling control layer 63 causes weak exchange coupling. Therefore, the thickness is preferably determined as being from 0.5 to 3 nm.

The first nonmagnetic metal layer 66 is a layer for securing conductivity between the first ferromagnetic layer 64 and the magnetic domain wall displacement layer 62 and for cutting off the magnetic coupling between the first ferromagnetic layer 64 and the magnetic domain wall displacement layer 62. Here, to cut off magnetic coupling means that the direction of magnetization is not fixed to a specified relation for a section of the magnetic domain wall displacement layer 62 which section faces the first ferromagnetic layer 64 with the first nonmagnetic metal layer 66 put between. More specifically, this means that, in the section in contact with the first nonmagnetic metal layer 66 in the magnetic domain wall displacement layer 62, the direction of magnetization can be taken as either state of rightward and leftward when the direction magnetization of the first ferromagnetic layer 64 is rightward. The materials for the first nonmagnetic metal layer 66 are preferably Cu, Cr, V, Ru, and their alloys. The thickness thereof is preferably made equal to that of the first exchange coupling control layer 63.

The area ratio of the first exchange coupling control layer 63 to the first nonmagnetic metal layer 66 is determined as necessary depending on the desired size and the electric resistance of the whole element. The ratio is preferably from 0.1:1 to 1:0.1 and, in particular, is preferably from 0.5:1 to 1:0.5. The position of the first nonmagnetic metal layer 66 is determined to be closer to the second magnetic layer group 101 than that of the first exchange coupling control layer 63 with the later explained operation principle taken into consideration.

The magnetic domain wall displacement layer 62 is a layer that makes the electric resistance of the whole element shown in FIG. 14 change depending on the position of the magnetic domain wall 73 formed in the layer and brings about hysteresis. The detailed explanation of the operation thereof will be given later. The material can be any magnetic material with a magnetic domain wall presented therein, for which a material such as magnetic metal, ferromagnetic semiconductor or ferromagnetic oxide can be used. This is preferably a material such as permalloy, a CoFe alloy, a CoFeB alloy, a NiCoFe alloy, a CoCrFeAl alloy, Fe, a FePt alloy, a NiMnSb alloy, a CoMn group alloy, $Sr_2FeMoO_6$, $Fe_2O_3$, or CoHfTa. Particularly preferable is permalloy, $Co_{90}Fe_{10}$, $Co_2MnAl$, $Co_2MnSi$, or $Co_2MnGe$. The film thickness thereof is preferably from 50 nm to 500 nm. It is necessary that the direction of magnetization of the magnetic domain wall displacement layer 62a on the first electrode 65 side can be easily controlled depending on the direction of magnetization of the first ferromagnetic layer 64, or that the direction of magnetization of the magnetic domain wall displacement layer 62b on the second electrode 71 side can be easily controlled depending on the direction of magnetization of the second ferromagnetic layer 70. Therefore, the coercive force of the magnetic domain wall displacement layer 62 is preferably equal to 10 Oe or less. The size thereof only needs to be a size with which the first magnetic layer group 100 and the second magnetic layer group 101 are formed while being separated with a desired distance and, for integrating a plurality of elements with a high density, a rectangular shape with a width from 30 to 200 nm and a length from 50 to 1000 nm is preferable.

The intermediate exchange coupling control layer 72, the intermediate ferromagnetic layer 68, the second exchange coupling control layer 69 and the second ferromagnetic layer 70 are for providing antiferromagnetic coupling between the second ferromagnetic layer 70 and the intermediate ferromagnetic layer 68, and between the intermediate ferromagnetic layer 68 and the magnetic domain wall displacement layer 62b on the second electrode 71 side. By the antiferromagnetic coupling thus provided, the direction of magnetization of the magnetic domain wall displacement layer 62b on the second electrode 71 side is fixed in the same direction as the direction of the magnetization of the second ferromagnetic layer 70. Furthermore, by adequately controlling the film thickness of the intermediate ferromagnetic layer 68, spins of injected electrons is controlled.

The intermediate exchange coupling control layer 72 is a nonmagnetic layer for separating the intermediate ferromagnetic layer 68 and the magnetic domain wall displacement layer 62 with a specified clearance to control an exchange coupling constant in the exchange coupling between the intermediate ferromagnetic layer 68 and the magnetic domain wall displacement layer 62b on the second electrode 71 side. The material and the film thickness of the intermediate exchange coupling control layer 72 is determined similarly to those for the first exchange coupling control layer 63.

The intermediate nonmagnetic metal layer 67 is a layer for securing conductivity between the intermediate ferromagnetic layer 68 and the magnetic domain wall displacement layer 62 and, along with this, for cutting off the magnetic coupling between the intermediate ferromagnetic layer 68 and the magnetic domain wall displacement layer 62. The meaning of cutting off the magnetic coupling is as was explained before. The materials for the intermediate nonmagnetic metal layer 67 are preferably Cu, Cr, V, Ru, and their alloys. The thickness thereof is preferably made equal to that of the intermediate exchange coupling control layer 72.

The area ratio of the intermediate exchange coupling control layer 72 to the intermediate nonmagnetic metal layer 67 is determined as necessary depending on the desired size and the electric resistance of the whole element. The ratio is preferably from 0.1:1 to 1:0.1 and, in particular, is preferably from 0.5:1 to 1:0.5. The position of the intermediate nonmagnetic metal layer 67 is determined to be closer to the first magnetic layer group 100 than that of the intermediate exchange coupling control layer 72 with the later explained operation principle taken into consideration.

The intermediate ferromagnetic layer 68 is for providing the above antiferromagnetic coupling and for injecting electrons into the adjacent layer with the spins of injected electrons being conserved. For example, electrons injected from the intermediate nonmagnetic metal layer 67 pass through the intermediate ferromagnetic layer 68 and are injected into the second exchange coupling control layer 69 with respective polarized states of electron spins almost being conserved. The film thickness of the intermediate ferromagnetic layer 68 must be made smaller compared with the relaxation length of electron spin. Thus, the film thickness of the intermediate ferromagnetic layer 68 is preferably 50 nm or less. For well conserving the polarized state of electron spin, the film thickness between 5 nm and 20 nm is particularly preferable. Moreover, the direction of magnetization of the intermediate ferromagnetic layer 68 must be easily controlled by the magnetization of the second ferromagnetic layer 70. Thus, the material of the intermediate ferromagnetic layer 68 is preferably provided as a material having a smaller coercive force compared with the material of the second ferromagnetic layer 70. Thus, materials such as a CoHfTa alloy, a CoZrNb alloy, a CoFe alloy, a FeCoN alloy, a FeAlN alloy, a $Ni_{45}Fe_{55}$ alloy, a $Ni_{81}Fe_{19}$ alloy, a NiFeMo alloy, and a FeTaN alloy are preferable. Furthermore, the coercive force is preferably provided as 20 Oe or less.

The second exchange coupling control layer 69 is a nonmagnetic layer for separating the intermediate ferromagnetic layer 68 and the second ferromagnetic layer 70 with a specified clearance to control an exchange coupling constant in the exchange coupling between the intermediate ferromagnetic layer 68 and the second ferromagnetic layer 70. The material and the film thickness of the second exchange coupling control layer 69 is determined similarly to those for the first exchange coupling control layer 63.

The material of the second ferromagnetic layer 70 can be selected as necessary from materials having ferromagnetism. For example, alloys such as a Co alloy, a CoPt alloy, a CoPtCr alloy, and a CoCr alloy can be used. During the operation of the element, the magnetization of the second ferromagnetic layer 70 is preferably fixed in one direction. Thus, the second ferromagnetic layer 70 has preferably a high coercive force and a large film thickness. The coercive force is preferably from 2000 to 4000 Oe and the thickness is preferably from 50 nm to 200 nm.

The material of the second electrode 71 can be selected as required when it is a conductive material. The thickness thereof is preferably within the range from several tens of nanometers to several hundreds of nanometers and its area is preferably within the range from 50 nm×50 nm to 300 nm×300 nm. Moreover, the shape thereof is preferably a rectangle, but can be a circle or an oval as desired.

Each of the total area of the first exchange coupling control layer 63 and the first nonmagnetic metal layer 66 and the area of the first ferromagnetic layer 64 is preferably made equivalent to the area of the first electrode 65. Moreover, each of the total area of the intermediate exchange coupling control layer 72 and the intermediate nonmagnetic metal layer 67 and the area of each of the layers from the intermediate ferromagnetic layer 68 to the second ferromagnetic layer 70 is preferably made equivalent to the area of the second electrode 71.

Each of the layers on the substrate 60 can be formed by a known deposition method for which methods such as sputtering, CVD, and evaporation can be used.

Also in the element shown in FIG. 14, by using the arrangement shown in FIG. 9, the first electrodes 65 of the element are connected to a plurality of horizontally running word lines 32 and the second electrodes 71 are connected to a plurality of vertically running bit lines 31, which enables realization of an integrated magnetic memory.

The operation principle of the element according to the third embodiment will be explained using FIGS. 15A and 15B. First, the operation principle in the case of carrying out writing or recording in the element will be explained. Referring to FIG. 15A, the element is initialized first. Here, the element is in a magnetized state when a strong rightward magnetic field equivalent to a saturation magnetic field is applied to the element to provide rightward magnetization of all of the first ferromagnetic layer 64 and the second ferromagnetic layer 70 before the magnetic field is removed.

In the magnetic domain wall displacement layer 62, the relation between the direction of magnetization in the section in contact with the first exchange coupling control layer 63 and the direction of magnetization in the first ferromagnetic layer 64 is the same as the relation in the element shown in FIG. 7. Moreover, in the magnetic domain wall displacement layer 62, the relation among the direction of magnetization in the section in contact with the intermediate exchange coupling control layer 72, the direction of magnetization in the intermediate ferromagnetic layer 68 and the direction of magnetization in the second ferromagnetic layer 70 is also the same as the relation in the element shown in FIG. 7. In the magnetic domain wall displacement layer 62, the direction of magnetization in the section in contact with the first nonmagnetic metal layer 66 and the direction of magnetization in the section in contact with the intermediate nonmagnetic metal layer 67 are not fixed as explained in the foregoing. Therefore, in FIG. 15A, for example, the magnetic domain wall displacement layer 62b on the second electrode 71 side extends to a position under the first ferromagnetic layer 64. In this case, electrons can move in the path through the first ferromagnetic layer 64, the first nonmagnetic metal layer 66, and the magnetic domain wall displacement layer 62b. When the film thickness of the magnetic domain wall displacement layer 62 is large, the magnetic domain wall displacement layer 62a on the first electrode 65 side is to localize in the vicinity of the first exchange coupling control layer 63 as shown in FIG. 8A.

In the element in the state as shown in FIG. 15A, a current made to continuously flow from the second electrode 71 to the first electrode 65 causes the magnetic domain wall 73 to displace in the direction opposite to the direction of the current, by which the magnetic domain wall disposition as shown in FIG. 15B is presented. When the current is made stopped, the antiferromagnetic coupling between the intermediate ferromagnetic layer 68 and the magnetic domain wall displacement layer 62b on the second electrode 71 side causes magnetization in the direction opposite to the direction of magnetization of the intermediate ferromagnetic layer 68 to be invariably induced in the magnetic domain wall displacement layer 62b on the second electrode 71 side. Therefore, one stable magnetic domain wall is formed in the magnetic domain wall displacement layer 62 without disappearance.

In the element in the state as shown in FIG. 15B, a current made to continuously flow from the first electrode 65 toward the second electrode 71 causes an operation carried out in reverse to the foregoing, by which the element is brought to the state as shown in FIG. 15A. The antiferromagnetic coupling between the first ferromagnetic layer 64 and the magnetic domain wall displacement layer 62a on the first electrode 65 side causes magnetization in the direction opposite to the direction of magnetization of the first ferromagnetic layer 64 to be invariably induced in the magnetic domain wall displacement layer 62a on the first electrode 65 side. Therefore, one stable magnetic domain wall is formed in the magnetic domain wall displacement layer 62 without disappearance. In this way, by reversing the direction of current, the magnetic domain wall 73 can be freely made positioned at either end section of the magnetic domain wall displacement layer 62.

The operation principle in the case of reading out a record or detecting a state of magnetization in the element will be explained. The operation principle is the same as that explained regarding the first embodiment, which is based on the fact that the behavior of electron spin differs depending on the relative relation between a thickness of a magnetic layer and an electron spin relaxation length. In the following, a method of detecting difference in electric resistance of an element will be explained with the case of letting a detecting current flow from the second electrode 71 to the first electrode 65 (namely, the case of injecting electrons from the first electrode 65 toward the second electrode 71) for the element shown in FIG. 14 taken as an example. Moreover, the meaning that each layer is "thick" or "thin" is as follows. The case where a distance in which an electron passes through in the layer is equivalent to or more compared with the electron spin relaxation length is expressed as being "thick", and the case where the distance is sufficiently shorter compared with the electron spin relaxation length is expressed as being "thin".

As was explained above, the electric resistance of the element is largely changed depending on whether the states of magnetization of the thick magnetic layers are in antiparallel or in parallel and an influence of the magnetization of the thin magnetic layer between the thick magnetic layers on the electric resistance is small. In the case of the magnetized state shown in FIG. 15A, all of the directions of magnetization in the first ferromagnetic layer 64, the magnetic domain wall displacement layer 62b on the second electrode 71 side and the second ferromagnetic layer 70 as thick magnetic layers are the same. Compared with this, in the case of the magnetized state shown in FIG. 15B, in the first ferromagnetic layer 64, the magnetic domain wall displacement layer 62a on the first electrode 65 side, and the second ferromagnetic layer 70 as thick magnetic layers, the directions of magnetization in the magnetic layers adjacent to each other are opposite to each other. Consequently, the electric resistance in the state shown in FIG. 15B becomes larger than the electric resistance in the state shown in FIG. 15A. Therefore, by measuring electric resistance across both of the electrodes, the state of internal magnetization of the element can be easily detected.

Moreover, detection of a flowed current by continuous detection of the state of magnetization of the element and multi-value recording by stepwise classification of the change in electric resistance can be also brought into realization according to the method explained about the first embodiment.

The arrangement shown in FIG. 14 can be modified as necessary within the range without departing from the gist of the invention. For example, antiferromagnetic coupling can be changed to ferromagnetic coupling. In the following, more specific explanations will be presented.

Figure 16:
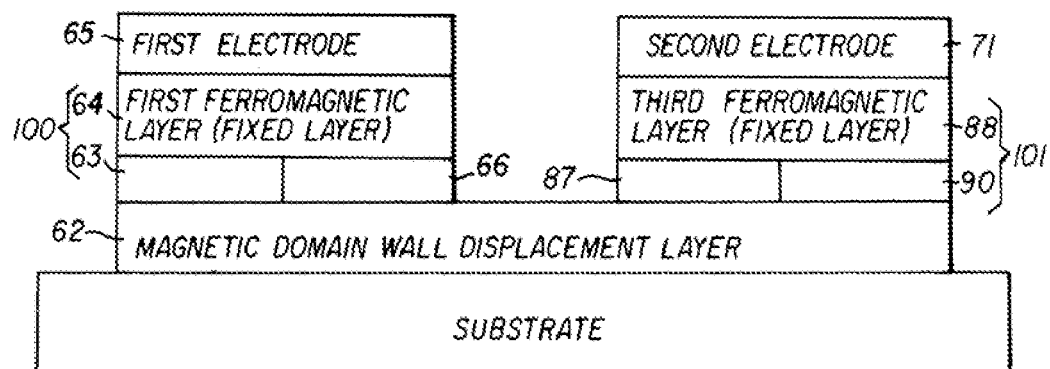
FIG. 16 is a schematic cross sectional view for explaining an example of another arrangement of the third embodiment of the spin injection magnetic domain wall displacement element according to the invention.

FIG. 16 is a schematic cross sectional view for explaining an example of another arrangement of the third embodiment of the spin injection magnetic domain wall displacement element according to the invention. On a substrate 60, a magnetic domain wall displacement layer 62 is formed, on the one end of which a first magnetic layer group 100 and a first electrode 65 are formed in the order. On the other end of the magnetic domain wall displacement layer 62, the second magnetic layer group 101 and a second electrode 71 are formed in the order. In the first magnetic layer group 100, a first exchange coupling control layer 63 and a first nonmagnetic metal layer 66 are formed adjacent to each other, on both of which a first ferromagnetic layer 64 is formed. In the second magnetic layer group 101, a third nonmagnetic metal layer 87 and a third exchange coupling control layer 90 are formed adjacent to each other, on both of which a third ferromagnetic layer 88 is formed.

Figure 17A:
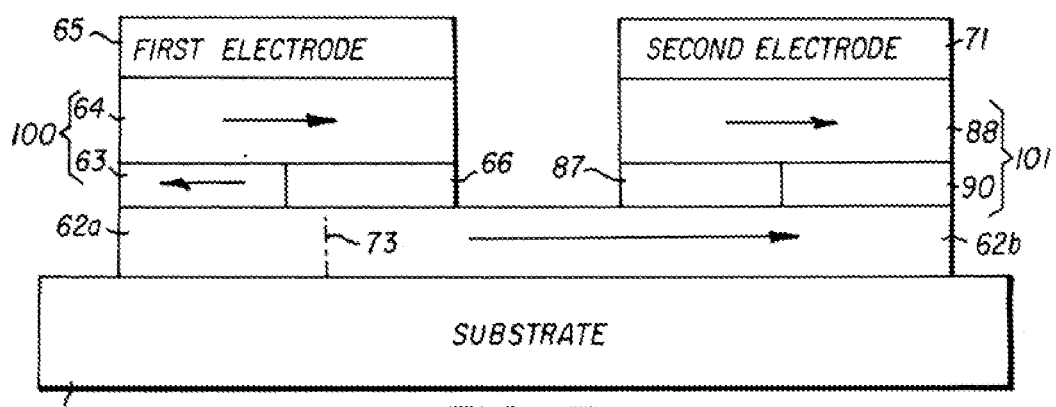
FIG. 17A illustrates FIG. 16 in an initialized state for explaining the operation principle thereof.
Figure 17B:
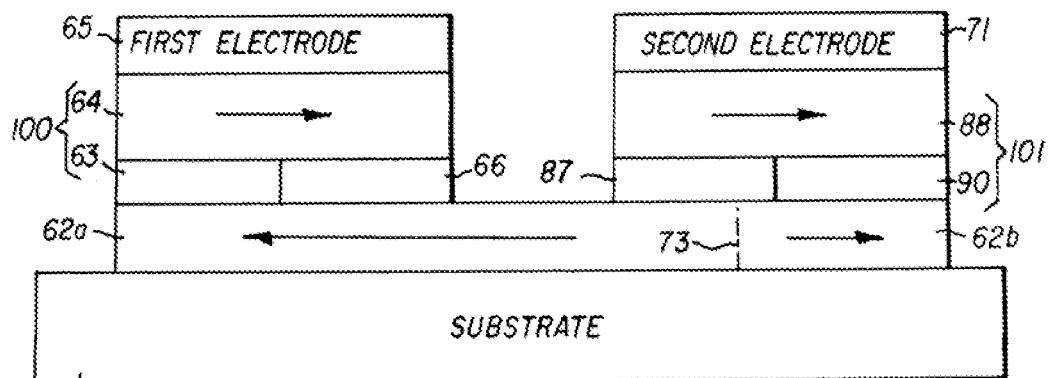
FIG. 17B is a schematic cross sectional view illustrates FIG. 17A in a state when a current is made to flow from a second electrode to a first electrode in the element in the state shown in FIG. 17A for explaining the operation principle of the element of FIG. 16.
Figure 18:
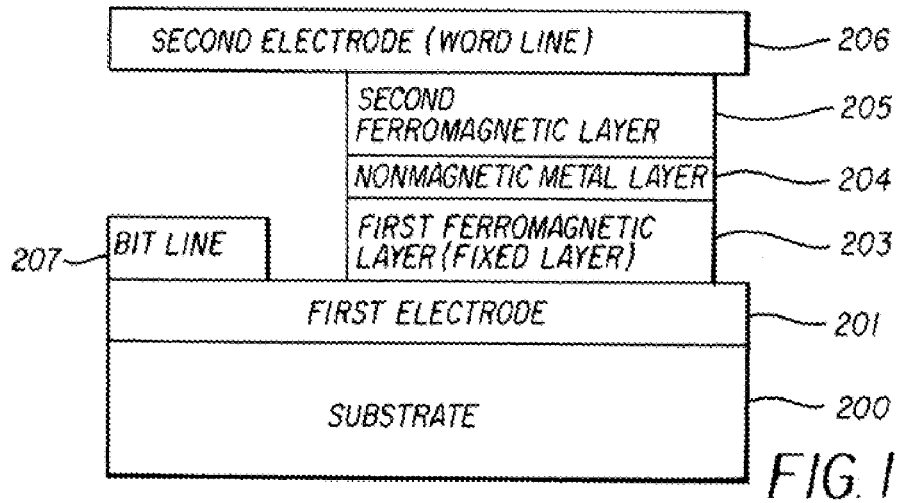
FIG. 18 is a schematic cross sectional view for explaining an example of an arrangement of a related GMR element.
Figure 19A:
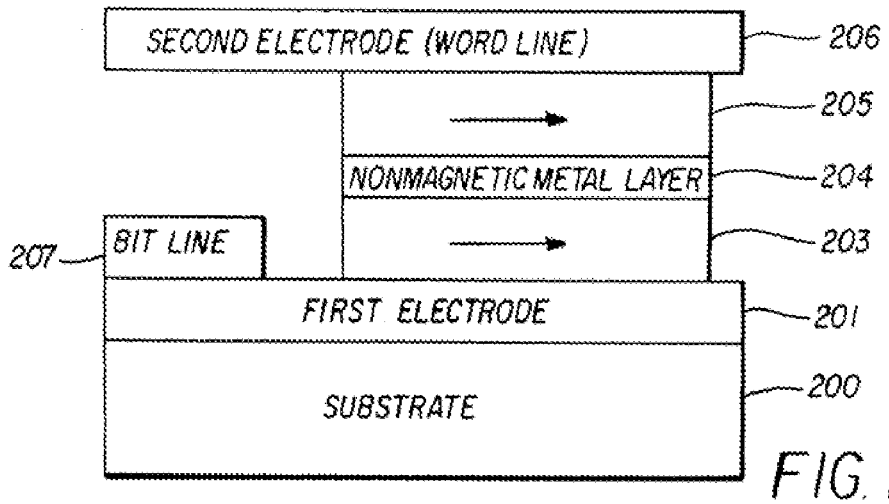
FIG. 19A illustrates FIG. 18 in the P-state for explaining the operation principle thereof.
Figure 19B:
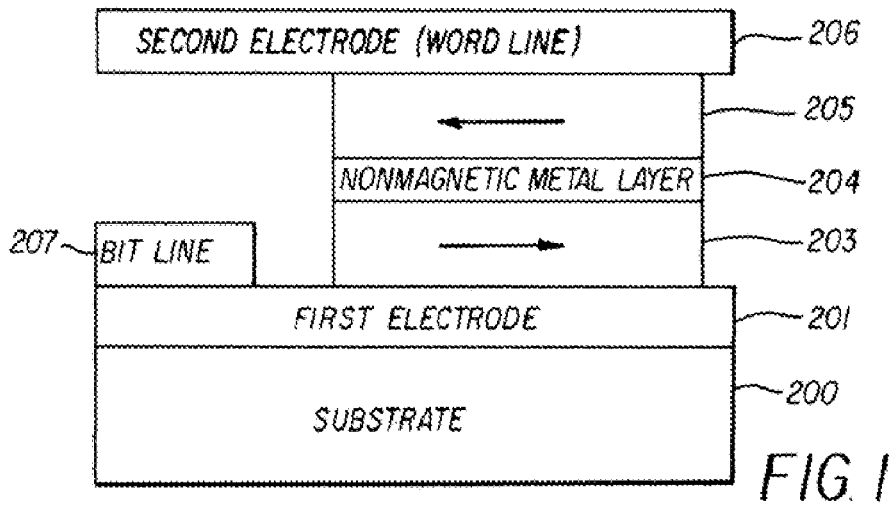
FIG. 19B illustrates FIG. 19A in the AP-state for explaining the operation principle of thereof.

FIGS. 17A and 17B are for explaining the operation principle of the element with the arrangement shown in FIG. 16. In each of the magnetic layers in the element shown in FIG. 16, the direction of magnetization thereof is shown with an arrow. The magnetic domain wall displacement layer 62 is divided by a magnetic domain wall 73 into a magnetic domain wall displacement layer 62a on the first electrode 65 side and a magnetic domain wall displacement layer 62b on the second electrode 71 side.

The substrate 60, the first electrode 65, the first ferromagnetic layer 64, the first exchange coupling control layer 63, the first nonmagnetic metal layer 66 and the second electrode 71 are arranged similarly to those in the element of FIG. 14.

The magnetic domain wall displacement layer 62 differs from that in the element shown in FIG. 14 in a method of controlling the magnetic domain wall displacement layer 62b on the second electrode 71 side. However, the material, the film thickness and the magnetic characteristic thereof are provided similarly to those of the element shown in FIG. 14.

The third exchange coupling control layer 90 and the third ferromagnetic layer 88 are for providing ferromagnetic coupling between the third ferromagnetic layer 88 and the magnetic domain wall displacement layer 62b on the second electrode 71 side. By the ferromagnetic coupling thus provided, the direction of magnetization of the magnetic domain wall displacement layer 62b on the second electrode 71 side is fixed in the same direction as the direction of the magnetization of the third ferromagnetic layer 88.

The third exchange coupling control layer 90 is a nonmagnetic layer for separating the magnetic domain wall displacement layer 62 and the third ferromagnetic layer 88 with a specified clearance to control an exchange coupling constant in the exchange coupling between the magnetic domain wall displacement layer 62b on the second electrode 71 side and the third ferromagnetic layer 88. The material of the third exchange coupling control layer 90 is determined similarly to that for the first exchange coupling control layer 63. Moreover, the film thickness thereof is determined so that ferromagnetic coupling is provided between the magnetic domain wall displacement layer 62b on the second electrode 71 side and the third ferromagnetic layer 88.

The third nonmagnetic metal layer 87 is a layer for securing conductivity between the third ferromagnetic layer 88 and the magnetic domain wall displacement layer 62 and, along with this, for cutting off the magnetic coupling between the third ferromagnetic layer 88 and the magnetic domain wall displacement layer 62. The meaning of cutting off the magnetic coupling is as was explained before. The materials for the third nonmagnetic metal layer 87 are preferably Cu, Cr, V, Ru, and their alloys. The thickness thereof is preferably made equal to that of the third exchange coupling control layer 90.

The area ratio of the third exchange coupling control layer 90 to the third nonmagnetic metal layer 87 is determined as necessary depending on the desired size and the electric resistance of the whole element. The ratio is preferably from 0.1:1 to 1:0.1 and, in particular, is preferably from 0.5:1 to 1:0.5. The position of the third nonmagnetic metal layer 87 is determined to be closer to the first magnetic layer group 100 than that of the third exchange coupling control layer 90 with the later explained operation principle taken into consideration.

The material of the third ferromagnetic layer 88 can be selected as necessary from materials having ferromagnetism. For example, alloys such as a Co alloy, a CoPt alloy, a CoPtCr alloy, and a CoCr alloy can be used. During the operation of the element, the magnetization of the third ferromagnetic layer 88 is preferably fixed in one direction. Thus, the third ferromagnetic layer 88 has preferably a high coercive force and a large film thickness. The coercive force is preferably from 2000 to 4000 Oe and the thickness is preferably from 50 nm to 200 nm.

Each of the total area of the third exchange coupling control layer 90 and the third nonmagnetic metal layer 87 and the area of the third ferromagnetic layer 88 is preferably made equivalent to the area of the second electrode 71.

Each of the layers on the substrate 60 can be formed by a known deposition method for which methods such as sputtering, CVD, and evaporation can be used.

The operation principle is the same as that of the element shown in FIG. 14. Writing is carried out on the basis that the magnetic domain wall 73 is made displaced to positions such as those shown in FIGS. 17A and 17B depending on the direction of a current supplied between the first electrode 65 and the second electrode 71. When a sufficient amount of the current is made to flow from the first electrode 65 to the second electrode 71, a magnetized state becomes as that shown in FIG. 17A, in which the magnetic domain wall displacement layer 62b on the second electrode 71 side extends to a position under the first ferromagnetic layer 64. Conversely, when a sufficient amount of the current is made to flow from the second electrode 71 to the first electrode 65, the magnetized state becomes as that shown in FIG. 17B, in which the magnetic domain wall displacement layer 62a on the first electrode 65 side extends to a position under the third ferromagnetic layer 88.

Reading is carried out on the basis that the electric resistance of the element is largely changed depending on whether the states of magnetization of the thick magnetic layers are in antiparallel or in parallel and an influence of the magnetization of the thin magnetic layer between the thick magnetic layers on the electric resistance is small. In the case of the magnetized state shown in FIG. 17A, all of the directions of magnetization in the first ferromagnetic layer 64, the magnetic domain wall displacement layer 62b on the second electrode 71 side and the third ferromagnetic layer 88 as thick magnetic layers are the same. Compared with this, in the case of the magnetized state shown in FIG. 17B, in the first ferromagnetic layer 64, the magnetic domain wall displacement layer 62a on the first electrode 65 side and the third ferromagnetic layer 88 as thick magnetic layers, the directions of magnetization in the magnetic layers adjacent to each other are opposite to each other. Consequently, the electric resistance in the state shown in FIG. 17B becomes larger than the electric resistance in the state shown in FIG. 17A.

Other arrangement of the third embodiment can be made where the order of the layers from the first electrode 65 to the second electrode 71 is just reversed in each of the foregoing arrangements.

More detailed explanations will be made with specific examples. Example 1 is one in which an element with the arrangement shown in FIG. 1 is fabricated and operated. For the substrate 4, a quartz plate with a thickness of 500 μm was used, on which the following layers were formed by sputtering. The first electrode 5 of Cu was formed with a thickness of 200 nm and an area of 500 nm×500 nm. Thereafter, the first ferromagnetic layer 6 of a CoPt alloy was formed with a thickness of 200 nm, an area of 100 nm×100 nm and a coercive force of 2500 Oe. Then, the first exchange coupling control layer 7 of Ru was formed with a thickness of 0.8 nm and an area of 100 nm×100 nm. Next, the magnetic domain wall displacement layer 8 of $Ni_{80}Fe_{20}$ was formed with a thickness of 200 nm, an area of 100 nm×100 nm and a coercive force of 5 Oe. Subsequently, the intermediate exchange coupling control layer 9 of Ru was formed with a thickness of 0.8 nm and an area of 100 nm×100 nm. Next, the intermediate ferromagnetic layer 10 of CoHfTa was formed with a thickness of 15 nm, an area of 100 nm×100 nm and a coercive force of 5 Oe. Thereafter, the second exchange coupling control layer 11 of Ru was formed with a thickness of 0.8 nm and an area of 100 nm×100 nm. Next, the second ferromagnetic layer 12 of a CoPt alloy was formed with a thickness of 200 nm, an area of 100 nm×100 nm, and a coercive force of 2500 Oe. Then, the second electrode 2 of Au was formed with a thickness of 200 nm and an area of 500 nm×500 nm. Finally, the bit line 1 of Al was formed to provide Example 1.

By using the element, an evaluation was carried out with the following procedures. At the beginning, a magnetic field of 5000 Oe was applied to initialize the element into the state shown in FIG. 2A. Following this, as a first procedure, a driving current of 10 mA (with a current density of $1\times10^8$ $A/cm^2$) was made to flow from the second electrode 2 toward the first electrode 5 to bring the element into the state shown in FIG. 2B. Then, electric resistance between the first electrode 5 and the second electrode 2 at this time was measured with a detecting current at 300 μA. Next, as a second procedure, a driving current of 10 mA (with a current density of $1\times10^8$ $A/cm^2$) was made to flow from the first electrode 5 toward the second electrode 2 to bring the element into the state shown in FIG. 2A. Then, the electric resistance between the first electrode 5 and the second electrode 2 at this time was measured with a detecting current at 300 μA. With the direction of the current alternately reversed, each of the first and second procedures was carried out ten times, by which an average of the electric resistance values in each procedure was obtained. The average of electric resistance values in the state shown in FIG. 2A was 1.4 Ω and the average of electric resistance values in the state shown in FIG. 2B was 1.6 Ω. Stable measured values were obtained in each of the procedures, by which the memory operation of the element can be confirmed.

Example 2 is one in which an element with the arrangement shown in FIG. 3 is fabricated and operated. For the substrate 4, a silicon substrate with a thickness of 500 μm with a 500 nm thick oxide film formed thereon was used, on which the following layers were formed by using sputtering. The first electrode 5 of Cu was formed with a thickness of 200 nm and an area of 500 nm×500 nm. Thereafter, the first ferromagnetic layer 6 of a CoPt alloy was formed with a thickness of 200 nm, an area of 100 nm×100 nm and a coercive force of 2500 Oe. Then, the first exchange coupling control layer 7 of Ru was formed with a thickness of 0.8 nm and an area of 100 nm×100 nm. Next, the magnetic domain wall displacement layer 8 of $Ni_{80}Fe_{20}$ was formed with a thickness of 200 nm, an area of 100 nm×100 nm, and a coercive force of 5 Oe. Subsequently, the third exchange coupling control layer 121 of Ru was formed with a thickness of 0.8 nm and an area of 100 nm×100 nm. Next, the third ferromagnetic layer 122 of a CoPt alloy was formed with a thickness of 200 nm, an area of 100 nm×100 nm, and a coercive force of 2500 Oe. Then, the second electrode 2 of Au was formed with a thickness of 200 nm and an area of 500 nm×500 nm. Finally, the bit line 1 of Al was formed to provide Example 2.

By using the element, an evaluation was carried out similarly to that for Example 1. With the magnetic field strength for initialization given at 5000 Oe, the current density of the driving current given at $1×10^8$ A/cm$^2$ and the detecting current given at 300 μA, the electric resistance value in each of the first and second procedures was measured ten times. The average of electric resistance values in the state shown in FIG. 4A was 3.2 Ω and the average of electric resistance values in the state shown in FIG. 4B was 3.6 Ω. Stable measured values were obtained in each of the procedures, by which the memory operation of the element can be confirmed.

Example 3 is one in which an element with the arrangement shown in FIG. 5 is fabricated and operated. For the substrate 4, a silicon substrate with a thickness of 500 μm with a 500 nm thick oxide film formed thereon was used, on which the following layers were formed by using sputtering. The first electrode 5 of Cu was formed with a thickness of 200 nm and an area of 500 nm×500 nm. Thereafter, the first ferromagnetic layer 6 of a CoPt alloy was formed with a thickness of 200 nm, an area of 100 nm×100 nm, and a coercive force of 2500 Oe. Then, the first exchange coupling control layer 7 of Ru was formed with a thickness of 0.8 nm and an area of 100 nm×100 nm. Next, the magnetic domain wall displacement layer 8 of $Ni_{80}Fe_{20}$ was formed with a thickness of 200 nm, an area of 100 nm×100 nm, and a coercive force of 5 Oe. Subsequently, the fourth ferromagnetic layer 142 of a CoPt alloy was formed with a thickness of 200 nm, an area of 100 nm×100 nm, and a coercive force of 2500 Oe. Then, the second electrode 2 of Au was formed with a thickness of 200 nm and an area of 500 nm×500 nm. Finally, the bit line 1 was formed to provide Example 3.

By using the element, an evaluation was carried out similarly to that for Example 1. With the magnetic field strength for initialization given at 5000 Oe, the current density of the driving current given at $1×10^8$ A/cm$^2$ and the detecting current given at 300 μA, the electric resistance value in each of the first and second procedures was measured ten times. The average of electric resistance values in the state shown in FIG. 6A was 3.2 Ω and the average of electric resistance values in the state shown in FIG. 6B was 3.6Ω. Stable measured values were obtained in each of the procedures, by which the memory operation of the element can be confirmed.

Example 4 is one in which an element with the arrangement shown in FIG. 7 is fabricated and operated. For the substrate 20, a silicon substrate with a thickness of 500 μm with a 500 nm thick oxide film formed thereon was used, on which the following layers were formed by using sputtering. The magnetic domain wall displacement layer 22 of $Ni_{80}Fe_{20}$ was formed with a thickness of 100 nm, a width of 200 nm, a length of 1000 nm, and a coercive force of 5 Oe. Thereafter, the first exchange coupling control layer 23 of Ru was formed with a thickness of 0.8 nm and an area of 100 nm×100 nm. Then, the first ferromagnetic layer 24 of a CoPt alloy was formed with a thickness of 200 nm, an area of 100 nm×100 nm, and a coercive force of 2500 Oe. Next, the first electrode 25 of Au was formed with a thickness of 200 nm and an area of 100 nm×100 nm. Subsequently, the intermediate exchange coupling control layer 26 of Ru was formed with a thickness of 0.8 nm and an area of 100 nm×100 nm. Next, the intermediate ferromagnetic layer 27 of CoHfTa was formed with a thickness of 15 nm, an area of 100 nm×100 nm, and a coercive force of 5 Oe. Thereafter, the second exchange coupling control layer 28 of Ru was formed with a thickness of 0.8 nm and an area of 100 nm×100 nm. Next, the second ferromagnetic layer 29 of a CoPt alloy was formed with a thickness of 200 nm, an area of 100 nm×100 nm, and a coercive force of 2500 Oe. Then, the second electrode 30 of Au was formed with a thickness of 200 nm and an area of 100 nm×100 nm to provide Example 4.

By using the element, an evaluation was carried out similarly to that for Example 1. With the magnetic field strength for initialization given at 5000 Oe, the current density of the driving current given at $1×10^8$ A/cm$^2$ and the detecting current given at 300 μA, the electric resistance value in each of the first and second procedures was measured ten times. The average of electric resistance values in the state shown in FIG. 8A was 3.2 Ω and the average of electric resistance values in the state shown in FIG. 8B was 3.6 Ω. Stable measured values were obtained in each of the procedures, by which the memory operation of the element can be confirmed.

Example 5 is one in which an element with the arrangement shown in FIG. 10 is fabricated and operated. For the substrate 20, a silicon substrate with a thickness of 500 μm with a 500 nm thick oxide film formed thereon was used, on which the following layers were formed by using sputtering. The magnetic domain wall displacement layer 22 of $Ni_{80}Fe_{20}$ was formed with a thickness of 100 nm, a width of 200 nm, a length of 1000 nm, and a coercive force of 5 Oe. Thereafter, the first exchange coupling control layer 23 of Ru was formed with a thickness of 0.8 nm and an area of 100 nm×100 nm. Then, the first ferromagnetic layer 24 of a CoPt alloy was formed with a thickness of 200 nm, an area of 100 nm×100 nm, and a coercive force of 2500 Oe. Next, the first electrode 25 of Au was formed with a thickness of 200 nm and an area of 100 nm×100 nm. Subsequently, the third exchange coupling control layer 48 of Ru was formed with a thickness of 1.8 nm and an area of 100 nm×100 nm. Next, the third ferromagnetic layer 49 of a CoPt alloy was formed with a thickness of 200 nm, an area of 100 nm×100 nm, and a coercive force of 2500 Oe. Then, the second electrode 30 of Au was formed with a thickness of 200 nm and an area of 100 nm×100 nm to provide Example 5.

By using the element, an evaluation was carried out similarly to that for example 1. With the magnetic field strength for initialization given at 5000 Oe, the current density of the driving current given at $1×10^8$ A/cm$^2$ and the detecting current given at 300 μA, the electric resistance value in each of the first and second procedures was measured ten times. The average of electric resistance values in the state shown in FIG. 11A was 3.2 Ω and the average of electric resistance values in the state shown in FIG. 11B was 3.6 Ω. Stable measured values were obtained in each of the procedures, by which the memory operation of the element can be confirmed.

Example 6 is one in which an element with the arrangement shown in FIG. 12 is fabricated and operated. For the substrate 20, a silicon substrate with a thickness of 500 μm with a 500 nm thick oxide film formed thereon was used, on which the following layers were formed by using sputtering. The magnetic domain wall displacement layer 22 of $Ni_{80}Fe_{20}$ was formed with a thickness of 100 nm, a width of 200 nm, a length of 1000 nm, and a coercive force of 5 Oe. Thereafter, the first exchange coupling control layer 23 of Ru was formed with a thickness of 0.8 nm and an area of 100 nm×100 nm. Then, the first ferromagnetic layer 24 of a CoPt alloy was formed with a thickness of 200 nm, an area of 100 nm×100 nm, and a coercive force of 2500 Oe. Next, the first electrode 25 of Au was formed with a thickness of 200 nm and an area of 100 nm×100 nm. Subsequently, the fourth ferromagnetic layer 109 of a CoPt alloy was formed with a thickness of 200 nm, an area of 100 nm×100 nm, and a coercive force of 2500 Oe. Then, the second electrode 30 of Au was formed with a thickness of 200 nm and an area of 100 nm×100 nm to provide Example 6.

By using the element, an evaluation was carried out similarly to that for Example 1. With the magnetic field strength for initialization given at 5000 Oe, the current density of the driving current given at $1\times10^8$ $A/cm^2$ and the detecting current given at 300 μA, the electric resistance value in each of the first and second procedures was measured ten times. The average of electric resistance values in the state shown in FIG. 13A was 3.2 Ω and the average of electric resistance values in the state shown in FIG. 13B was 3.6 Ω. Stable measured values were obtained in each of the procedures, by which the memory operation of the element can be confirmed.

Example 7 is one in which an element with the arrangement shown in FIG. 14 is fabricated and operated. For the substrate 60, a silicon substrate with a thickness of 500 μm with a 500 nm thick oxide film formed thereon was used, on which the following layers were formed by using sputtering. The magnetic domain wall displacement layer 62 of $Ni_{80}Fe_{20}$ was formed with a thickness of 100 nm, a width of 200 nm, a length of 1000 nm, and a coercive force of 5 Oe. Thereafter, the first exchange coupling control layer 63 of Ru was formed with a thickness of 0.8 nm and an area of 100 nm×100 nm. Next, the first nonmagnetic metal layer 66 of Cu was formed with a thickness of 0.8 nm and an area of 100 nm×100 nm. Then, the first ferromagnetic layer 64 of a CoPt alloy was formed with a thickness of 200 nm, an area of 100 nm×200 nm, and a coercive force of 2500 Oe. Next, the first electrode 65 of Au was formed with a thickness of 200 nm and an area of 100 nm×200 nm. Subsequently, the intermediate nonmagnetic metal layer 67 of Cu was formed with a thickness of 0.8 nm and an area of 100 nm×100 nm. Thereafter, the intermediate exchange coupling control layer 72 of Ru was formed with a thickness of 0.8 nm and an area of 100 nm×100 nm. Next, the intermediate ferromagnetic layer 68 of CoHfTa was formed with a thickness of 15 nm, an area of 100 nm×200 nm, and a coercive force of 5 Oe. Thereafter, the second exchange coupling control layer 69 of Ru was formed with a thickness of 0.8 nm and an area of 100 nm×200 nm. Next, the second ferromagnetic layer 70 of a CoPt alloy was formed with a thickness of 200 nm, an area of 100 nm×200 nm, and a coercive force of 2500 Oe. Then, the second electrode 71 of Au was formed with a thickness of 200 nm and an area of 100 nm×200 nm to provide Example 7.

By using the element, an evaluation was carried out similarly to that for Example 1. With the magnetic field strength for initialization given at 5000 Oe, the current density of the driving current given at $1\times10^8$ $A/cm^2$ and the detecting current given at 300 μA, the electric resistance value in each of the first and second procedures was measured ten times. The average of electric resistance values in the state shown in FIG. 15A was 3.4 Ω and the average of electric resistance values in the state shown in FIG. 15B was 3.6 Ω. Stable measured values were obtained in each of the procedures, by which the memory operation of the element can be confirmed.

Example 8 is one in which an element with the arrangement shown in FIG. 16 is fabricated and operated. For the substrate 60, a silicon substrate with a thickness of 500 μm with a 500 nm thick oxide film formed thereon was used, on which the following layers were formed by using sputtering. The magnetic domain wall displacement layer 62 of $Ni_{80}Fe_{20}$ was formed with a thickness of 100 nm, a width of 200 nm, a length of 1000 nm, and a coercive force of 5 Oe. Thereafter, the first exchange coupling control layer 63 of Ru was formed with a thickness of 0.8 nm and an area of 100 nm×100 nm. After this, the first nonmagnetic metal layer 66 of Cu was formed with a thickness of 0.8 nm and an area of 100 nm×100 nm. Then, the first ferromagnetic layer 64 of a CoPt alloy was formed with a thickness of 200 nm, an area of 100 nm×200 nm, and a coercive force of 2500 Oe. Next, the first electrode 65 of Au was formed with a thickness of 200 nm and an area of 100 nm×200 nm. Subsequently, the third nonmagnetic metal layer 87 of Cu was formed with a thickness of 1.8 nm and an area of 100 nm×100 nm. Thereafter, the third exchange coupling control layer 90 of Ru was formed with a thickness of 1.8 nm and an area of 100 nm×100 nm. Next, the third ferromagnetic layer 88 of a CoPt alloy was formed with a thickness of 200 nm, an area of 100 nm×200 nm, and a coercive force of 2500 Oe. Then, the second electrode 71 of Au was formed with a thickness of 200 nm and an area of 100 nm×200 nm to provide Example 8.

By using the element, an evaluation was carried out similarly to that for Example 1. With the magnetic field strength for initialization given at 5000 Oe, the current density of the driving current given at $1\times10^8$ $A/cm^2$ and the detecting current given at 300 μA, the electric resistance value in each of the first and second procedures was measured ten times. The average of electric resistance values in the state shown in FIG. 17A was 3.2 Ω and the average of electric resistance values in the state shown in FIG. 17B was 3.6 Ω. Stable measured values were obtained in each of the procedures, by which the memory operation of the element can be confirmed.

By arranging a ferromagnetic layer with a large coercive force outside a magnetic domain wall displacement layer and providing antiferromagnetic or ferromagnetic coupling between the ferromagnetic layer and the magnetic domain wall displacement layer, it became feasible to record and reproduce a position of a magnetic domain wall as a change in electric resistance.

Furthermore, by providing antiferromagnetic or ferromagnetic coupling between a ferromagnet and the magnetic domain wall displacement layer, it became possible to stabilize the magnetic domain wall and the position of the magnetic domain wall. As a result, even though the volume or the saturation magnetization of the magnetic domain wall displacement layer is brought to be small for making the magnetic domain wall displacement in the magnetic domain wall displacement layer carried out at a high speed and at a low current, it is possible to secure thermal stability of the recorded magnetic domain wall. This enabled realization of high speed operation, operating current reduction and thermal stability in recording magnetization of the element with compatibility among them being assured.

A measure, such as one by which a large number of the elements according to the invention are integrated on a substrate, on which silicon semiconductor CMOS circuits are integrated, while being combined with the circuits, enables realization of a magnetic random access memory having a large recording capacity and including no mechanical driving sections. In addition, the element according to the invention exhibits magnetoresistance effect that changes the state of magnetization in the element depending on the direction of a current flowing between terminals to change electric resistance between the terminals. Thus, the element can be also used as a weak current sensor.

While the present invention has been particularly shown and described with reference to particular embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-107114, filed on 4 Apr. 2005. The disclosure of the priority application, in its entirety, including the drawings, claims, and the specification thereof, is incorporated herein by reference.

What is claimed is:

1. A spin injection magnetic domain wall displacement element comprising:
   a magnetic domain wall displacement layer having a magnetic domain wall;
   a first magnetic layer group having at least one ferromagnetic layer; and
   a second magnetic layer group having at least one ferromagnetic layer,
   wherein the first magnetic layer group is disposed at one end of the magnetic domain wall displacement layer and the second magnetic layer group disposed at the other end of the magnetic domain wall displacement layer, and
   wherein the magnetic domain wall in the magnetic domain wall displacement layer is displaceable by flowing electrons between the first magnetic layer group and the second magnetic layer group.

2. The spin injection magnetic domain wall displacement element according to claim 1, wherein at least part of the magnetic domain wall displacement layer is in contact with the first magnetic layer group and is in antiferromagnetic coupling with the first magnetic layer group, and at least part of the magnetic domain wall displacement layer is in contact with the second magnetic layer group and is in antiferromagnetic or ferromagnetic coupling with the second magnetic layer group.

3. The spin injection magnetic domain wall displacement element according to claim 2, wherein the first magnetic layer group and the second magnetic layer group are disposed on different surfaces of the magnetic domain wall displacement layer and positioned opposing each other while holding the magnetic domain wall displacement layer therebetween.

4. The spin injection magnetic domain wall displacement element according to claim 2, wherein the first magnetic layer group and the second magnetic layer group are disposed on the same surface of the magnetic domain wall displacement layer.

5. The spin injection magnetic domain wall displacement element according to claim 3, wherein the first magnetic layer group comprises a nonmagnetic first exchange coupling control layer and a first ferromagnetic layer laminated together, and the first exchange coupling control layer is in contact with the magnetic domain wall displacement layer.

6. The spin injection magnetic domain wall displacement element according to claim 4, wherein the first magnetic layer group comprises a nonmagnetic first exchange coupling control layer and a first ferromagnetic layer laminated together, and the first exchange coupling control layer is in contact with the magnetic domain wall displacement layer.

7. The spin injection magnetic domain wall displacement element according to claim 3, wherein the second magnetic layer group comprises a nonmagnetic intermediate exchange coupling control layer, an intermediate ferromagnetic layer, a nonmagnetic second exchange coupling control layer, and a second ferromagnetic layer laminated in this order, and the intermediate exchange coupling control layer is in contact with the magnetic domain wall displacement layer.

8. The spin injection magnetic domain wall displacement element according to claim 4, wherein the second magnetic layer group comprises a nonmagnetic intermediate exchange coupling control layer, an intermediate ferromagnetic layer, a nonmagnetic second exchange coupling control layer, and a second ferromagnetic layer laminated in this order, and the intermediate exchange coupling control layer is in contact with the magnetic domain wall displacement layer.

9. The spin injection magnetic domain wall displacement element according to claim 5, wherein the second magnetic layer group comprises a nonmagnetic intermediate exchange coupling control layer, an intermediate ferromagnetic layer, a nonmagnetic second exchange coupling control layer, and a second ferromagnetic layer laminated in this order, and the intermediate exchange coupling control layer is in contact with the magnetic domain wall displacement layer.

10. The spin injection magnetic domain wall displacement element according to claim 7, wherein the film thickness of the intermediate ferromagnetic layer is smaller than the spin relaxation length of electrons in the intermediate ferromagnetic layer.

11. The spin injection magnetic domain wall displacement element according to claim 8, wherein the film thickness of the intermediate ferromagnetic layer is smaller than the spin relaxation length of electrons in the intermediate ferromagnetic layer.

12. The spin injection magnetic domain wall displacement element according to claim 9, wherein the film thickness of the intermediate ferromagnetic layer is smaller than the spin relaxation length of electrons in the intermediate ferromagnetic layer.

13. The spin injection magnetic domain wall displacement element according to claim 4, wherein:
   the first magnetic layer group comprises a nonmagnetic layer and a first ferromagnetic layer laminated together,
   the nonmagnetic layer comprises a first exchange coupling control layer and a first nonmagnetic metal layer, and
   both the first exchange coupling control layer and the first nonmagnetic metal layer are in contact with the magnetic domain wall displacement layer.

14. The spin injection magnetic domain wall displacement element according to claim 4, wherein:
   the second magnetic layer group comprises a nonmagnetic layer, an intermediate ferromagnetic layer, a nonmagnetic second exchange coupling control layer and a second ferromagnetic layer being laminated in this order, the nonmagnetic layer comprises an intermediate exchange coupling control layer and an intermediate nonmagnetic metal layer, and both the intermediate exchange coupling control layer and the intermediate nonmagnetic metal layer are in contact with the magnetic domain wall displacement layer.

15. The spin injection magnetic domain wall displacement element according to claim 13, wherein:

the second magnetic layer group comprises a nonmagnetic layer, an intermediate ferromagnetic layer, a nonmagnetic second exchange coupling control layer and a second ferromagnetic layer being laminated in this order, the nonmagnetic layer comprises an intermediate exchange coupling control layer and an intermediate nonmagnetic metal layer, and both the intermediate exchange coupling control layer and the intermediate nonmagnetic metal layer are in contact with the magnetic domain wall displacement layer.

16. The spin injection magnetic domain wall displacement element according to claim 3, wherein the first magnetic layer group comprises a first exchange coupling control layer and a first ferromagnetic layer laminated together, and the first exchange coupling control layer is in contact with the magnetic domain wall displacement layer.

17. The spin injection magnetic domain wall displacement element according to claim 4, wherein the first magnetic layer group comprises a first exchange coupling control layer and a first ferromagnetic layer laminated together, and the first exchange coupling control layer is in contact with the magnetic domain wall displacement layer.

18. The spin injection magnetic domain wall displacement element according to claim 3, wherein the second magnetic layer group comprises a nonmagnetic third exchange coupling control layer and a third ferromagnetic layer laminated together, and the third exchange coupling control layer is in contact with the magnetic domain wall displacement layer.

19. The spin injection magnetic domain wall displacement element according to claim 4, wherein the second magnetic layer group comprises a nonmagnetic third exchange coupling control layer and a third ferromagnetic layer laminated together, and the third exchange coupling control layer is in contact with the magnetic domain wall displacement layer.

20. The spin injection magnetic domain wall displacement element according to claim 16, wherein the second magnetic layer group comprises a nonmagnetic third exchange coupling control layer and a third ferromagnetic layer laminated together, and the third exchange coupling control layer is in contact with the magnetic domain wall displacement layer.

21. The spin injection magnetic domain wall displacement element according to claim 17, wherein the second magnetic layer group comprises a nonmagnetic third exchange coupling control layer and a third ferromagnetic layer laminated together, and the third exchange coupling control layer is in contact with the magnetic domain wall displacement layer.

22. The spin injection magnetic domain wall displacement element according to claim 3, wherein the second magnetic layer group comprises a fourth ferromagnetic layer.

23. The spin injection magnetic domain wall displacement element according to claim 4, wherein the second magnetic layer group comprises a nonmagnetic third exchange coupling control layer and a third ferromagnetic layer laminated together, and the third exchange coupling control layer is in contact with the magnetic domain wall displacement layer.

24. The spin injection magnetic domain wall displacement element according to claim 16, wherein the second magnetic layer group comprises a nonmagnetic third exchange coupling control layer and a third ferromagnetic layer laminated together, and the third exchange coupling control layer is in contact with the magnetic domain wall displacement layer.

25. The spin injection magnetic domain wall displacement element according to claim 17, wherein the second magnetic layer group comprises a nonmagnetic third exchange coupling control layer and a third ferromagnetic layer laminated together, and the third exchange coupling control layer is in contact with the magnetic domain wall displacement layer.

26. The spin injection magnetic domain wall displacement element according to claim 4, wherein:

the second magnetic layer group comprises a nonmagnetic layer and a third ferromagnetic layer laminated together, the nonmagnetic layer comprises a third exchange coupling control layer and a third nonmagnetic metal layer, and both the third exchange coupling control layer and the third nonmagnetic metal layer are in contact with the magnetic domain wall displacement layer.

27. The spin injection magnetic domain wall displacement element according to claim 13, wherein:

the second magnetic layer group comprises a nonmagnetic layer and a third ferromagnetic layer laminated together, the nonmagnetic layer comprises a third exchange coupling control layer and a third nonmagnetic metal layer, and both the third exchange coupling control layer and the third nonmagnetic metal layer are in contact with the magnetic domain wall displacement layer.

28. A spin injection magnetic domain wall displacement device comprising:

a plurality of the spin injection magnetic domain wall displacement elements, each element comprising:

a magnetic domain wall displacement layer having a magnetic domain wall;

a first magnetic layer group having at least one ferromagnetic layer; and a second magnetic layer group having at least one ferromagnetic layer, wherein the first magnetic layer group is disposed at one end of the magnetic domain wall displacement layer and the second magnetic layer group disposed at the other end of the magnetic domain wall displacement layer, and wherein the magnetic domain wall in the magnetic domain wall displacement layer is displaceable by flowing electrons between the first magnetic layer group and the second magnetic layer group, and wherein the spin injection magnetic domain wall displacement elements are coupled with one another with the first magnetic layer groups thereof connected to bit lines and with the second magnetic layer groups thereof connected to word lines.

29. The spin injection magnetic domain wall displacement device according to claim 28, wherein the device carries out writing and reading based on the difference in electric resistance.

* * * * *